(12) United States Patent
Iwata et al.

(10) Patent No.: US 7,141,849 B2
(45) Date of Patent: Nov. 28, 2006

(54) SEMICONDUCTOR STORAGE DEVICE HAVING A FUNCTION TO CONVERT CHANGES OF AN ELECTRIC CHARGE AMOUNT TO A CURRENT AMOUNT

(75) Inventors: Hiroshi Iwata, Nara (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/530,519

(22) PCT Filed: Oct. 1, 2003

(86) PCT No.: PCT/JP03/12583

§ 371 (c)(1),
(2), (4) Date: Oct. 28, 2005

(87) PCT Pub. No.: WO2004/034474

PCT Pub. Date: Apr. 22, 2004

(65) Prior Publication Data

US 2006/0131642 A1 Jun. 22, 2006

(30) Foreign Application Priority Data

Oct. 9, 2002 (JP) .............................. 2002-296001
May 14, 2003 (JP) .............................. 2003-136453

(51) Int. Cl.
*H01L 29/792* (2006.01)
(52) U.S. Cl. ...................... 257/324; 257/326
(58) Field of Classification Search ........ 257/314–316, 257/326, 324, 623
See application file for complete search history.

(56) References Cited

U.S. PATENT DOCUMENTS 5,880,499 A * 3/1999 Oyama ........................ 257/316
5,998,263 A * 12/1999 Sekariapuram et al. ..... 438/259
6,388,293 B1 5/2002 Ogura et al.
6,803,624 B1 * 10/2004 Rudeck et al. .............. 257/315
6,828,621 B1 * 12/2004 Kusumi et al. ............. 257/315
2004/0245564 A1 * 12/2004 Ogura et al. ................ 257/315
2006/0145243 A1 * 7/2006 Wong et al. ................ 257/316

FOREIGN PATENT DOCUMENTS

JP 5-81072 B2 11/1993

(Continued)

*Primary Examiner*—Hoai Pham
*Assistant Examiner*—Mursalin B. Hafiz
(74) *Attorney, Agent, or Firm*—Birch, Stewart, Kolasch & Birch, LLP

(57) ABSTRACT

In a semiconductor storage device, a gate insulating film and a gate electrode are laid on a first conductivity type semiconductor substrate, and charge holding portions are formed on both sides of the gate electrode. Second conductivity type first and second diffusion layer regions are formed in regions of the semiconductor substrate corresponding to the charge holding portions. The charge holding portions are each structured so as to change, in accordance with an electric charge amount held in the charge holding portions, a current amount flowing from one of the second conductivity type diffusion layer regions to the other of the diffusion layer regions through a channel region when voltage is applied to the gate electrode. Part of each charge holding portion is present below an interface of the gate insulating film and the channel region.

12 Claims, 12 Drawing Sheets

FOREIGN PATENT DOCUMENTS

| | | |
|---|---|---|
| JP | 9-116119 A | 5/1997 |
| JP | 2001-156188 A | 6/2001 |
| JP | 2001-230332 A | 8/2001 |
| JP | 2002-170891 A | 6/2002 |
| WO | WO-99/07000 A2 | 2/1999 |
| WO | WO-02/43158 A1 | 5/2002 |

\* cited by examiner

SEMICONDUCTOR STORAGE DEVICE HAVING A FUNCTION TO CONVERT CHANGES OF AN ELECTRIC CHARGE AMOUNT TO A CURRENT AMOUNT

This application is the U.S. National Phase of International Application PCT/JP2003/012583, filed Oct. 1, 2003, which designated the U.S. PCT/JP2003/012583 claims priority to JP Patent Applications No. 2002-296001, filed Oct. 9, 2002 and No. 2003-136453, filed May 14, 2003. The entire contents of these applications are incorporated herein by reference.

TECHNICAL FIELD

This invention relates to a semiconductor storage device. In particular, it relates to a semiconductor storage device having a field-effect transistor having a function to convert changes of an electric charge amount to a current amount.

BACKGROUND ART

Conventionally, there has been a nonvolatile memory capable of storing two bits by one field-effect transistor (e.g., see JP-2001-512290 A, published Aug. 21, 2001). The structure of this nonvolatile memory and the principle of its write (program) operation will be described hereinbelow.

As shown in FIG. 25, this memory is composed of a gate electrode 909 formed on a P type well region 901 through a gate insulating film, and a first N type diffusion layer region 902 and a second N type diffusion layer region 903 formed at the surface of the P type well region 901. The gate insulating film is composed of a so-called ONO (Oxide Nitride Oxide) film in which a silicon nitride film 906 is interposed between silicon oxide films 904 and 905. In the silicon nitride film 906, there are formed memory holding portions 907, 908 in the vicinity of the edge portions of the first and second N type diffusion layer regions 902, 903. An electric charge amount in each of these memory holding portions 907, 908 is read as a drain current of the transistor so that two-bit information is stored in one transistor.

Next description will be given of a write operation method in this nonvolatile memory. The term "write (or program)" is used herein to refer to the action of injecting electrons into the memory holding portion 907, 908. In JP-2001-512290 A, there has been disclosed a method for injecting electrons into a right memory holding portion 908 by applying 5.5V to the second diffusion layer region 903 and 10V to the gate electrode 909. This makes it possible to write to a specific one of the two memory holding portions. There has been also disclosed a method for erasing and reading from a specific side. By combining these methods, two-bit operation is enabled.

In the above-stated nonvolatile memory, in order to provide the gate insulating film with the function of operating the transistor as well as the function as a memory film for storing electric charges, the gate insulating film is formed into three-layer structure with use of the ONO film. This makes it difficult to manufacture thinner gate insulating films. Also, in the above nonvolatile memory, as the channel length is shortened, the two memory holding portions 907, 908 in one transistor interfere with each other, which makes two-bit operation difficult. This obstructs further miniaturization of the devices.

SUMMARY OF THE INVENTION

In view of the above problems, it is an object of the present invention to provide a semiconductor storage device allowing further miniaturization while fulfilling two-bit or more memory holding operation in one transistor.

In order to accomplish the above object, a semiconductor storage device according to the present invention includes a first conductivity type (e.g., one of the P and N types) semiconductor part composed of any one of a semiconductor substrate, a well region provided in a semiconductor substrate and a semiconductor film disposed on an insulator; a gate insulating film formed on the first conductivity type semiconductor part; a gate electrode formed on the gate insulating film; charge holding portions formed on opposite sides of the gate electrode; second conductivity type (e.g., the other of the P and N types) diffusion layer regions formed in regions of the first conductivity type semiconductor part corresponding to the respective charge holding portions; and a channel region below the gate electrode. The charge holding portions are each constructed so as to change, in accordance with an electric charge amount held in the charge holding portions, a current amount flowing from one of the second conductivity type diffusion layer regions to the other of the diffusion layer regions through the channel region when a voltage is applied to the gate electrode. Also, part of each charge holding portion is present below an interface of the gate insulating film and the channel region. The charge holding portion herein refers to a component allowing the injection and pulling of electrons or holes.

According to the semiconductor storage device with the above constitution, a change in the electric charge amount in the charge holding portion is converted to a current amount whereby it is operated as a memory cell. Since the two charge holding portions formed on the opposite sides of the gate electrode are formed independently of the gate insulating film, a memory function implemented by the charge holding portions and a transistor function implemented by the gate insulating film are separated. Therefore, while maintaining the sufficient memory function, the gate insulating film is made thinner, so that short channel effect can be easily prevented.

Since the two charge holding portions formed on both sides of the gate electrode are separated by the gate electrode, interference in rewrite operation can effectively be prevented. In other words, the distance between the two charge holding portions can be shortened. Accordingly, a semiconductor storage device allowing further miniaturization while fulfilling the two-bit or more memory holding in one transistor can be realized.

Furthermore, since part of each charge holding portion is present below the interface of the gate insulating film and the channel region, it follows that the charge holding portions are present in a direction in which high-energy electric charges proceed during a write operation. Thus, the injection efficiency of electric charges into the charge holding portions is markedly improved, so that the speed of write operation can greatly be improved. It is also possible to reduce the power consumption in writing if the current in the writing operation is reduced.

In the semiconductor storage device, a distance between the interface of the gate insulating film and the channel region and a plane approximately parallel to the interface and containing a bottom of each charge holding portion may be 2 nm to 15 nm.

With the above constitution, the positional relationship between the charge holding portions and the gate insulating film is optimized, thus making it possible to keep the operation speed high enough.

The semiconductor storage device may be configured such that the charge holding portions each include a first insulator having a function of holding electric charges; and a second insulator having a function of preventing dissipation of the electric charges held in the first insulator by separating the first insulator from the gate electrode, the channel region and the corresponding diffusion layer region.

With the above constitution, dissipation of the electric charges stored in the first insulator can efficiently be prevented. Thus, a semiconductor storage device with good charge holding characteristics is provided.

The semiconductor storage device may also be configured such that the charge holding portions each include a first insulator having a function of storing electric charges, and second and third insulators having a function of preventing dissipation of the electric charges held in the first insulator, and that the first insulator is interposed between the second insulator and the third insulator.

With the above constitution, the electric charges injected into the charge holding portion are blocked by the second and third insulators and stored in the first insulator efficiently. Therefore, the injection efficiency of electric charges into the charge holding portion is improved, so that a high-speed rewrite operation (write and erase operations) is realized.

The first insulator may be silicon nitride, and the second and third insulators may be silicon oxide.

With the above constitution, since the silicon nitride film in which a number of levels for trapping electric charges are present is used as the first insulator, and the silicon oxide film having a large bandgap is used as the second and third insulators, a semiconductor storage device having a large hysteresis property and good holding characteristics is provided. Further, because both of the silicon nitride and the silicon oxide are materials normally used in LSI process, the semiconductor storage device is advantageously easy to produce.

The semiconductor storage device may be configured such that the second insulator is provided in a manner so as to separate the first insulator from the gate electrode, the channel region and the corresponding diffusion layer region, and a thickness of the second insulator on the channel region is smaller than a thickness of the gate insulating film, but 0.8 nm or more.

According to the above constitution, the thickness of the second insulator that separates the first insulator being a charge holding film from the channel region is smaller than that of the gate insulating film, but 0.8 nm or more. Thus, without deteriorating the voltage withstanding performance or electric strength of the memory, reduction of voltage in the write operation and erase operation or implementing a high-speed write operation and erase operation is enabled. This makes it possible to increase memory effect.

The "memory effect" means that when a voltage is applied to the gate electrode, a current amount that flows from one of the diffusion layer regions to the other through the channel region is changed in accordance with an electric charge amount held in the charge holding film (charge holding portion). The memory effect being large means that the change of the current amount is large.

The semiconductor storage device may be configured such that the second insulator is formed in a manner so as to separate the first insulator from the gate electrode, the channel region and the diffusion layer region, and that a thickness of the second insulator on the channel region is larger than a thickness of the gate insulating film, but not more than 20 nm.

According to the above constitution, the thickness of the insulating film that separates the charge holding film from the channel region is larger than that of the gate insulating film, but not more than 20 nm. This makes it possible to improve the holding characteristics without deteriorating the memory short channel effect.

The first insulator may include a portion opposed to a plane parallel to a top surface of the gate insulating film, with the second insulator disposed therebetween, the portion of the first insulator extending along the plane (for example, the first insulator may include a portion having a surface generally parallel to the top surface of the gate insulating film.)

According to the above constitution, the rewrite speed can be increased while preventing the deterioration of the holding characteristics of the semiconductor storage device.

The first insulator may include a portion opposed to a side surface of the gate electrode, with the second insulator disposed therebetween, the portion of the first insulator extending along the side surface (for example, the first insulator may include a portion having a surface generally parallel to the side surface of the gate electrode.)

According to the above constitution, the rewrite speed of the semiconductor storage device can be increased.

In the semiconductor storage device, the charge holding portions may be arranged in a channel length direction such that at least part of each charge holding portion is laid on the corresponding diffusion layer region.

Further, a distance between the diffusion layer regions may be set longer than a gate electrode length in a channel length direction, and the charge holding portions may be arranged in the channel length direction such that only part of each charge holding portion is laid on the corresponding diffusion layer region.

The above constitution increases the read or sense current of the semiconductor storage device so that the dispersion of read or sense current may be controlled. Therefore, the readout operation of the semiconductor storage device can be made at a higher speed.

DETAILED DESCRIPTION OF THE INVENTION

The semiconductor storage device of this invention will be described in detail using examples illustrated.

(Embodiment 1)

Before describing a memory device constituting a semiconductor storage device of the present invention, a basic structure that is a premise of a memory device to which this invention is applied will be described first with reference to FIGS. 9 and 10.

Figure 9:
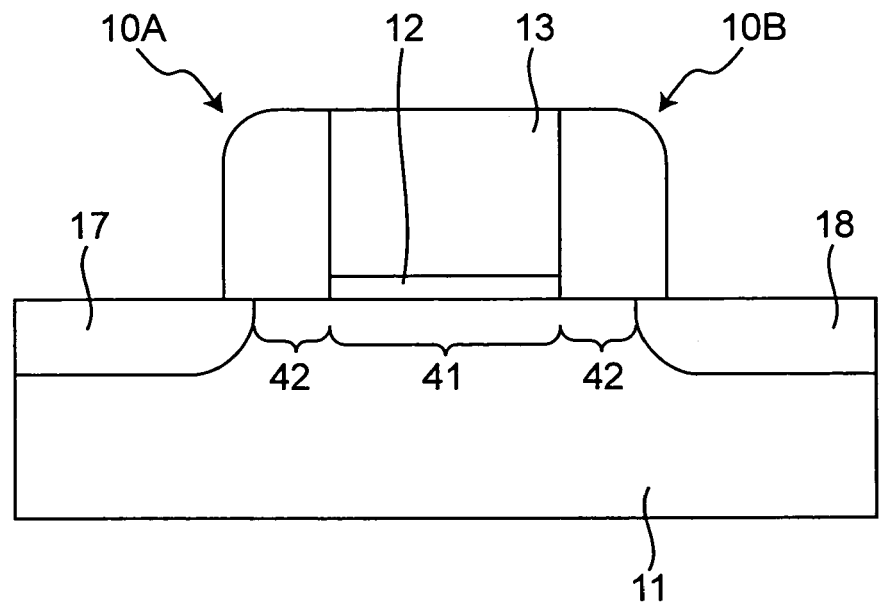
FIG. 9 is a schematic cross-sectional view of essential parts showing a basic structure of a semiconductor storage device of this invention.

FIG. 9 is a schematic cross-sectional view of a memory device. In the memory device as a nonvolatile memory cell capable of storing two bits, as shown in FIG. 9, a gate electrode 13 having a gate length similar to those of normal transistors is formed on a semiconductor substrate 11 that is one example of the first conductivity type (e.g., one of the P type or N type) semiconductor part, with a gate insulating film 12 therebetween. Charge holding portions 10A, 10B in the shape of side wall spacer are formed on side surfaces, or side walls of the gate insulating film 12 and the gate electrode 13 that are stacked. That is, one of the charge holding portions 10A and 10B is disposed on one of the side walls, while the other of the charge holding portions 10A and 10B is formed on the other of the side walls.

In regions of the semiconductor substrate 11 corresponding to the charge holding portions 10A, 10B on the side opposite from the gate electrode 13, there are formed a second conductivity type (e.g., the other of P or N type) first diffusion layer region 17 and a second conductivity type second diffusion layer region 18. The first and second diffusion layer regions (source/drain regions) 17, 18 are offset from edge portions of the gate electrode 13 (from a region 41 where the gate electrode 13 is formed). Thus, an offset region 42 is formed between each edge portion of the gate electrode 13 and the first/second diffusion layer region 17, 18 in the semiconductor substrate.

Thus, the charge holding portions 10A, 10B of the memory device are formed independently of the gate insulating film 12. Consequently, a memory function implemented by the charge holding portions 10A, 10B and a transistor function implemented by the gate insulating film 12 are separated. Since the two charge holding portions 10A, 10B formed on both sides of the gate electrode 13 are separated by the gate electrode 13, possible interference in the rewrite operation is effectively controlled. Therefore, the memory device is capable of storing two-bit or more information and enables easy miniaturization.

Further, since the first and second diffusion layer regions 17, 18 are offset from the gate electrode 13, easiness of inversion of the offset region 42 under the charge holding portion 10A, 10B (i.e., a region in the semiconductor substrate 11 opposite from the charge holding portion 10A, 10B) when a voltage is applied to the gate electrode is largely changed by an electric charge amount stored in the charge holding portion 10A, 10B, which enables increase of the memory effect. The "memory effect" means that when a voltage is applied to the gate electrode 13, a current amount that flows from one of the diffusion layer regions to the other through the channel region is changed in accordance with an electric charge amount held in the charge holding film (charge holding portion 10A, 10B). That the memory effect is large means that the change of the current amount is large.

Further, because of the structure in which the first and second diffusion layer regions 17, 18 are offset from the gate electrode 13, the short channel effect can be strongly prevented, compared with normal logic transistors, which enables further reduction of the gate length. Also, since the memory device is structurally suitable for controlling the short channel effect, it becomes possible to adopt a gate insulating film with a larger film thickness, compared with logic transistors, thereby enabling increase of reliability.

Figure 10:
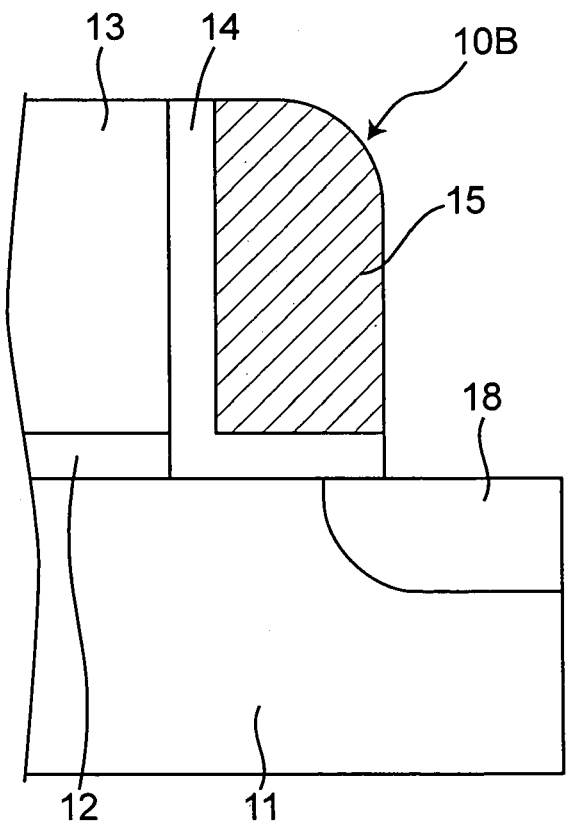
FIG. 10 is an enlarged view of part of FIG. 9.

FIG. 10 is an enlarged view of the charge holding portion 10B in the shape of sidewall spacer and its vicinity. As shown in FIG. 10, the charge holding portions 10A, 10B (only 10B is shown in FIG. 10) are each composed of a silicon nitride film 15 in the shape of side wall spacer that is an example of the first insulator and a silicon oxide film 14 that is an example of the second insulator for separating the silicon nitride film 15 from the gate electrode 13, the semiconductor substrate 11, and the first and second diffusion layer regions 17, 18. It is the silicon nitride film 15 that has a function of storing electric charges (electrons or holes), and the silicon oxide film 14 prevents the electric charges stored in the silicon nitride film 15 from leaking.

Figure 1:
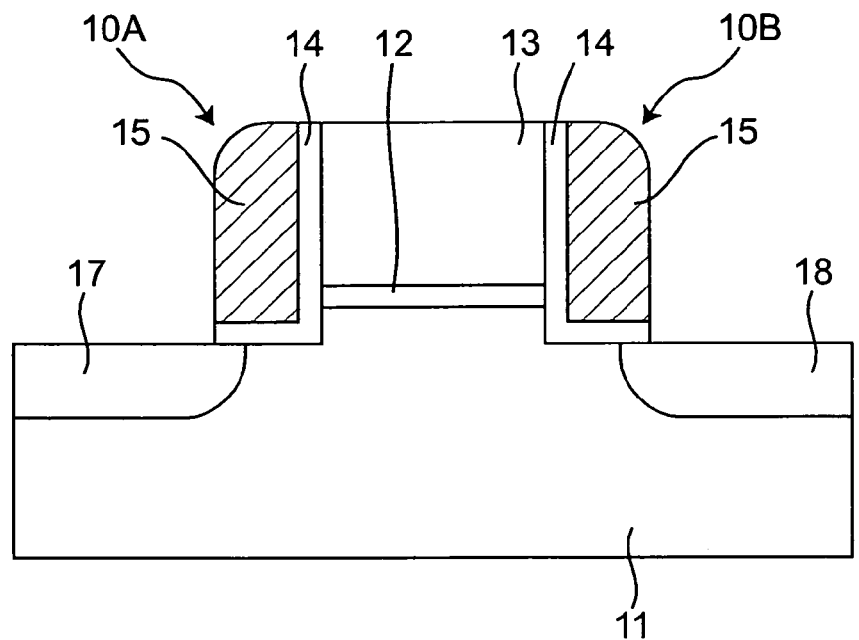
FIG. 1 is a schematic cross-sectional view of essential parts of one example of a semiconductor storage device according to Embodiment 1 of this invention.
Figure 2:
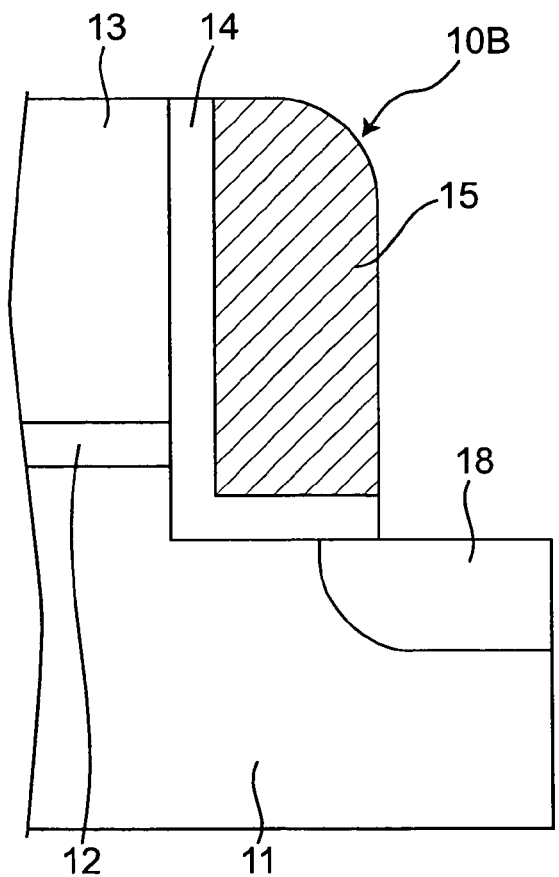
FIG. 2 is an enlarged view of a part of FIG. 1.
Figure 3:
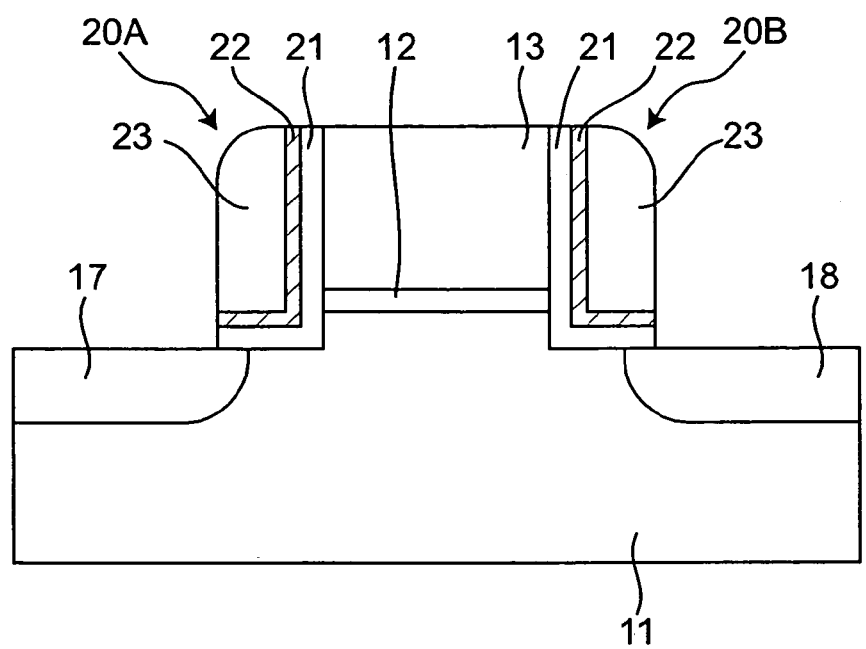
FIG. 3 is a schematic cross-sectional view of essential parts of a modified example of the semiconductor storage device according to Embodiment 1 of this invention.
Figure 4:
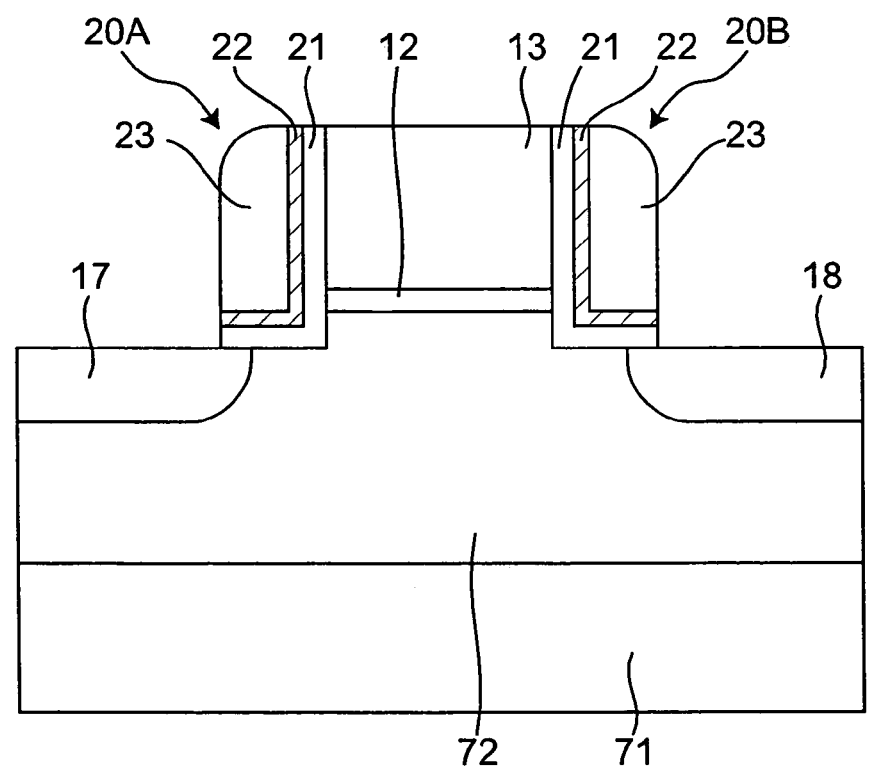
FIG. 4 is a schematic cross-sectional view of essential parts of another modified example of the semiconductor storage device according to Embodiment 1 of this invention.
Figure 5:
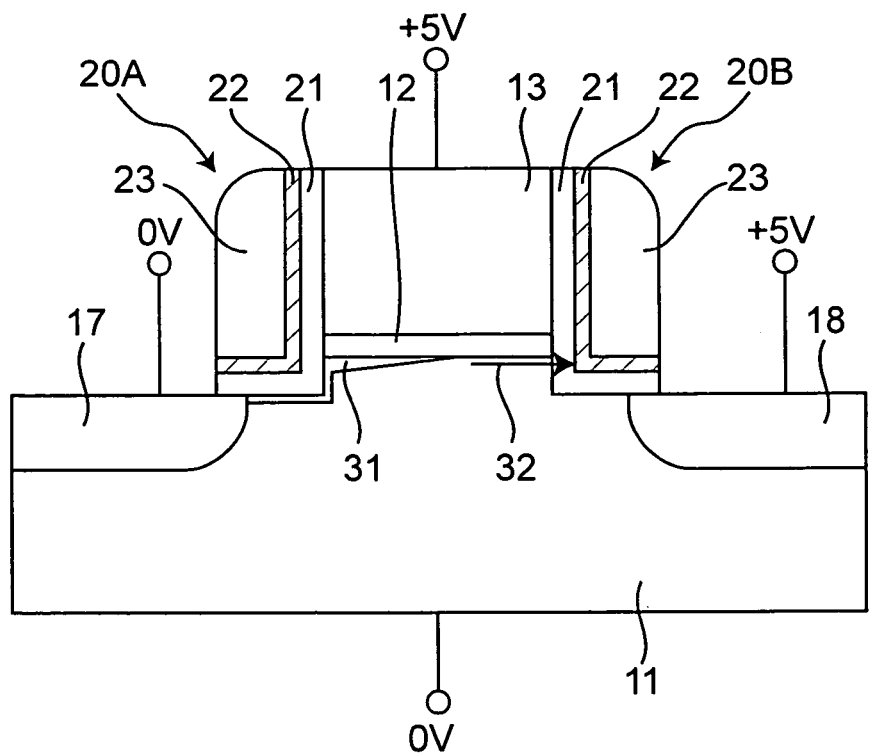
FIG. 5 is a view for describing a method of writing to a second charge holding portion.
Figure 6:
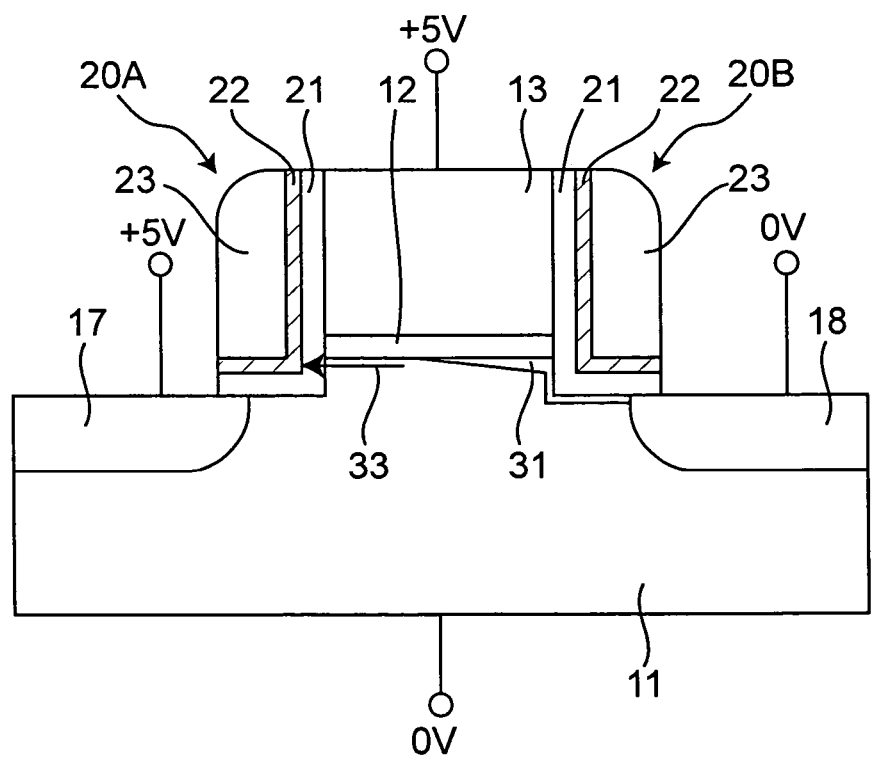
FIG. 6 is a view for describing a method of writing to a first charge holding portion.
Figure 7:
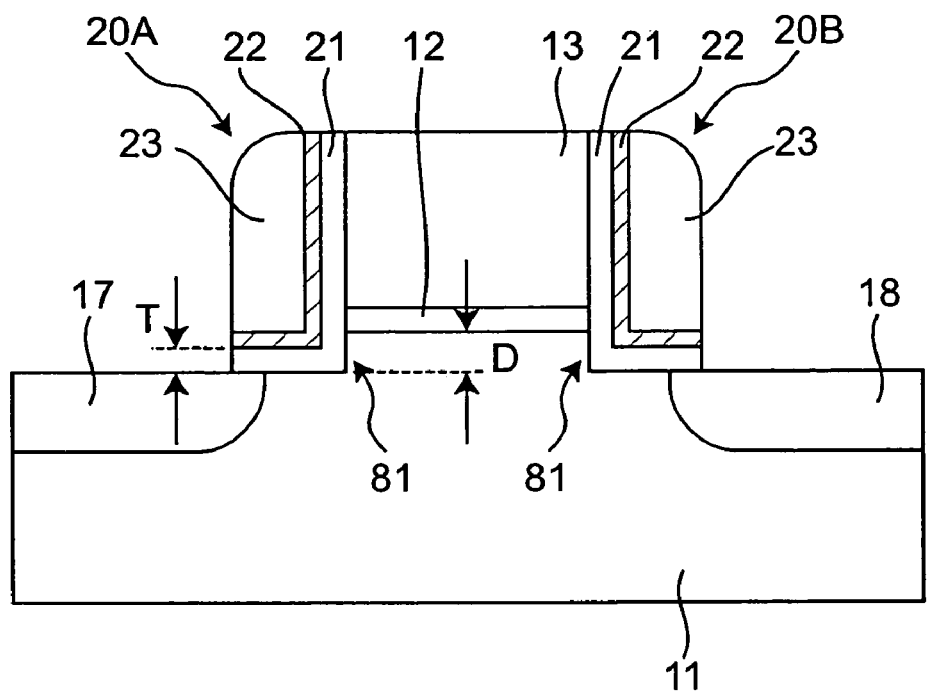
FIG. 7 is a view for describing a positional relationship between a gate insulating film and charge holding portions in the semiconductor storage device.
Figure 8:
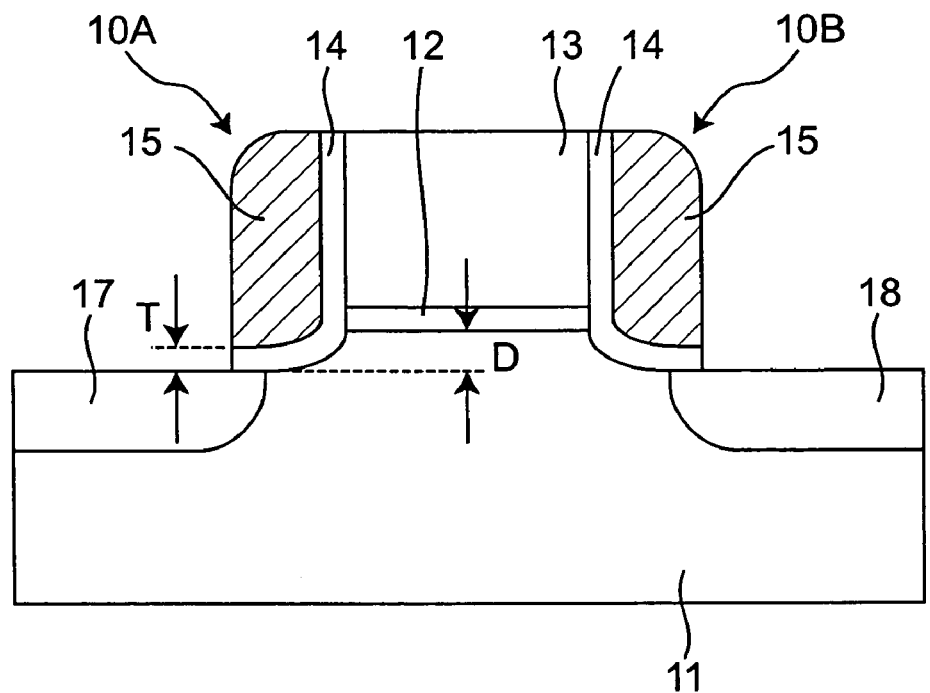
FIG. 8 is a view for describing a positional relationship between a gate insulating film and charge holding portions in the semiconductor storage device.

Next, examples of a memory device constituting the semiconductor storage device of this invention will be described below with reference to FIGS. 1–8. FIG. 1 and FIG. 2 are views showing one example of the memory device and a partly enlarged portion thereof, respectively. FIG. 3 shows a modified example in which the constitution in FIG. 1 is partly changed. FIG. 4 shows another modified example. FIGS. 5 and 6 are views for explaining a write operation in these examples, and FIGS. 7 and 8 are views for explaining a positional relationship between a gate insulating film and charge holding portions in the memory device.

FIG. 1 is a schematic cross-sectional view of a memory device as one embodiment of the semiconductor storage device of this invention. This memory device is different from the memory device shown in FIG. 9 in the positional relationship between the gate insulating film 12 and the charge holding portions 10A, 10B. That is, in the memory device shown in FIG. 1, part of each charge holding portion 10A, 10B is present below an interface between the gate insulating film 12 and the semiconductor substrate 11. A superficial portion of the semiconductor substrate 11 serves as a channel region.

In the memory device shown in FIG. 1, the same constituent parts as those of the memory device shown in FIG. 9 are designated by the same numerals and their description is omitted.

FIG. 2 is an enlarged view of the charge holding portion 10B in the shape of sidewall spacer and its vicinity. As shown in FIG. 2, the charge holding portions 10A, 10B (only 10B is shown in FIG. 2) is composed of a silicon nitride film 15 in the shape of side wall spacer and a silicon oxide film 14 for separating the silicon nitride film 15 from the gate electrode 13, the semiconductor substrate 11, and the first/second diffusion layer region 17, 18 (source/drain regions). It is the silicon nitride film 15 that has a function of storing electric charges (electrons or holes), and the silicon oxide film 14 prevents the electric charges stored in the silicon nitride film 15 from leaking.

FIG. 3 shows a schematic cross-sectional view of a memory device as a modified example of the memory device (semiconductor storage device) of this invention. The constitution of this memory device is different from that of the memory device shown in FIGS. 1 and 2. That is, as shown in FIG. 3, charge holding portions 20A, 20B each have a structure in which a silicon nitride film 22 as an example of the first insulator having a function of trapping electric charges is sandwiched between silicon oxide films 21, 23 as examples of second insulators.

In the memory device shown in FIG. 3, the same constituent parts as those of the memory device shown in FIG. 9 are designated by the same numerals and their description is omitted.

FIG. 4 shows a schematic cross-sectional view of a memory device as another modified example of the memory device (semiconductor storage device) of this invention. The constitution of this memory device is different from that shown in FIG. 3 in the substrate. That is, as shown in FIG. 4, here is used a substrate in which a semiconductor layer 72 is formed on an insulating layer 71. Examples of such a substrate include SOI substrates (the insulating layer 71 and the semiconductor layer 72 correspond to a buried oxide layer and an SOI layer respectively), and substrates formed by adopting wafer bonding technology.

In the memory device shown in FIG. 4, the same constituent parts as those of the memory device shown in FIG. 9 are designated by similar numerals and their description is omitted.

The memory device of the second modified example (FIG. 4) has the same effect as the memory device of the first modified example (FIG. 3).

The memory devices (FIGS. 1–4) are each characterized in that part of the charge holding portion 10A, 10B (20A, 20B) is present below an interface between the gate insulating film 12 and the semiconductor substrate 11 (semiconductor layer 72). The effect obtained by disposing the gate insulating film 12 and the charge holding portions 10A, 10B (20A, 20B) in this manner will be described below.

According to the above memory devices, high-speed write operation is enabled. It is noted that the term "write operation" refers to the action of injecting electrons into the charge holding portion when the memory device is of N channel type, and to the action of injecting holes into the charge holding portion when the memory device is of P channel type.

Next, a method of writing to the memory device will be described using FIGS. 5 and 6. The method of writing is common to the memory devices of the embodiments and even memory devices having the basic structure described above. The writing is performed by injecting electrons accelerated by drain electric fields into the charge holding portion.

First, in order to inject electrons (write) into the second charge holding portion 20B, as shown in FIG. 5, the first diffusion layer region 17 is used as a source electrode and the second diffusion layer region 18 is used as a drain electrode as shown in FIG. 5. For example, a 0V is applied to the first diffusion layer region 17 and the semiconductor substrate 11, +5V to the second diffusion layer region 18, and +5V to the gate electrode 13. Under these voltage conditions, an inversion layer 31 extends from the first diffusion layer region 17 (source electrode) but fails to reach the second diffusion layer region 18 (drain electrode), resulting in generation of a pinchoff point. Electrons are accelerated by drain electric fields from the pinchoff point to the second diffusion layer region 18 (drain electrode) and injected into the second charge holding portion 20B (more precisely the silicon nitride film 22 in the second charge holding portion 20B). The write operation is executed in this manner.

It is noted that in the vicinity of the first charge holding portion 20A, electrons accelerated by drain electric fields are not generated and therefore writing is not executed. The voltage for write operation is not limited to the above voltages. For example, when a 0V was applied to the first diffusion layer region 17 and the semiconductor substrate 11, +10V to the second diffusion layer region 18, and +5V to the gate electrode 13, hot electrons (thermoelectrons) were injected into the charge holding portion 20B, so that a write operation is implemented.

In this manner, electrons are injected into the second charge holding portion 20B so as to enable a write operation.

In the memory devices according to the first to third examples, it is possible to implement write operations extremely efficiently as compared with the memory device with the basic structure shown in FIGS. 9, 10. That is, in the memory device shown in FIGS. 9 and 10, among electrons that have been accelerated directed from the pinchoff point to the second diffusion region 18, only a small part of which are scattered upward and injected into the second charge holding portion 10B. On the other hand, in the memory devices of the above embodiments (FIGS. 1–4), electrons move toward a direction of arrow 32 in FIG. 5, a large part of which are injected as such into the silicon nitride film 22 in the charge holding portion 20B. In other words, because most of the electrons that have been accelerated from the pinchoff point have a large momentum in the direction of arrow 32, the number of electrons that pass the silicon oxide film 21 to be injected into the silicon nitride film 22 remarkably increases.

In this way, in the memory devices of the above embodiments, since the efficiency of write operation is remarkably improved, the speed of write operation can remarkably be improved. Or, in the case where the current in writing is small, the power consumption in writing to the semiconductor storage device can be reduced.

In order to inject electrons (write) into the first charge holding portion 20A, as shown in FIG. 6, the second diffusion layer region 18 is used as a source electrode, and the first diffusion layer region 17 is used as a drain electrode. For example, a 0V is applied to the second diffusion layer region 18 and the semiconductor substrate 11, +5V to the first diffusion layer region 17, and +5V to the gate electrode 13. In this case, electrons move toward a direction of arrow 33 and injected into the silicon nitride film 22 in the charge holding portion 20A. By thus switching the source and drain regions from the case of injecting electrons into the second charge holding portion 20B, electrons are injected into the first charge holding portion 20A for enabling write operation.

In the memory device shown in FIGS. 1 and 2, the silicon nitride film 15 having a function of storing electric charges is separated from the gate electrode 13, the semiconductor substrate 11, and the diffusion layer region 17, 18 by the silicon oxide film 14. The silicon oxide film 14 prevents dissipation of electric charges stored in the silicon nitride film 15. The silicon oxide film 14 preferably has a thickness of at least 2 nm, because if the thickness of the silicon oxide film 14 is less than 2 nm, tunneling effect of electric charges becomes outstanding, with the result that the retention time of the memory device becomes short.

In the case of the memory device shown in FIG. 3 or 4, the charge holding portions 20A, 20B each have a structure in which the silicon nitride film 22 as the first insulator having a function of trapping electric charges is interposed between the silicon oxide films 21, 23 as the second insulators. Therefore, electric charges injected into the charge holding portions 20A, 20B are blocked by the silicon oxide film 23 and stored in the silicon nitride film 22 efficiently. As described above, since the charge holding portion 20A, 20B has the structure in which the silicon nitride film 22 is interposed between the silicon oxide films 21, 23, the injection efficiency of electric charges into the charge holding portion 20A, 20B is improved, so that a high-speed rewrite operation (write and erase operations) is realized.

The structure of the charge holding portion is not limited to the above examples (FIGS. 1 to 4), and the charge holding portion, therefore, may contain nanometer-sized quantum dots having a function of storing electric charges. Also, the charge holding portion does not need to have a side wall shape, as long as the charge holding portion is in both sides of the gate electrode and part thereof is in contact with the semiconductor substrate 11 and the source/drain regions 17, 18. However, if the charge holding portion is formed to have a side wall shape, it can be formed using a self-alignment process in the same manner as in forming side walls of gate electrodes of transistors with a conventional structure. In this case, it becomes possible to easily form an LSI having both logic transistors and memory transistors by forming gate electrode side walls common to the logic and memory transistors.

Next, a preferred positional relationship between the gate insulating film 12 and the charge holding portions 20A, 20B will be described using FIGS. 7 and 8. The distance between an interface of the gate insulating film 12 and the semiconductor substrate 11 (first plane), and a plane containing a lower face of the charge holding portions 20A, 20B (second plane) is denoted by D. The thickness of the silicon oxide film 21 that separates the silicon nitride film 22 from the diffusion layer region 17, 18 is denoted by T. In the case of the memory device with the structure shown in FIG. 1, the thickness of the silicon oxide film 14 that separates the silicon nitride film 15 from the diffusion layer regions 17, 18 can be denoted by T. At this time, the distance D between the first plane and the second plane is preferably within the range of from 2 nm to 15 nm. The reason for that will be described below.

As described above, the thickness T of the silicon oxide film 21 (corresponding to the silicon oxide film 14 in FIG. 1) is preferably 2 nm or more. In the case where the thickness T of the silicon oxide film is 2 nm or more, but the distance D is less than 2 nm, the silicon nitride film 22 is not present below the interface (first plane) of the gate insulating film 12 and the semiconductor substrate 11. Therefore, electrons accelerated by the drain electric fields during the write operation are not directly injected into the silicon nitride film 22, resulting in deterioration of the efficiency of write operation. Accordingly, the distance D is preferably 2 nm or more.

On the other hand, in the case where the distance D is 15 nm or more, regions where inversion layers are hardly formed (corresponding to regions indicated by 81, 81 in FIG. 7) because of not being affected by gate electric fields become larger, so that the drive current of the transistor markedly decreases. This mainly causes an increased time of readout operation. Thus, the distance D is preferably not more than 15 nm.

Because of the reasons as above, the distance D between the interface (first plane) of the gate insulating film 12 and the semiconductor substrate 11, and the place (second plane) including the lower surface of the charge holding portions 20A, 20B having the memory function is preferably in the range of between 2 nm and 15 nm. Thereby, the positional relationship between the charge holding portions 20A, 20B and the gate insulating film 12 is optimized, which makes it possible to keep the operation speed of the memory device high enough.

Incidentally, the silicon oxide film 21 has a clearly-angled L shape in FIG. 7, but it may have a round shape as shown in 8. In this case, the distance D is defined as a distance between the interface (first plane) of the gate insulating film 12 and the semiconductor substrate 11, and a plane (second plane) approximately parallel to that interface and in contact with the lowermost surface portion of the charge holding portions 10A, 10B. The rounded silicon oxide film 21 improves the device characteristics as well as the reliability thereof by avoiding the concentration of the electric fields which would otherwise occur in an angled portion.

As described above, in any one of the above examples of the memory device as the semiconductor storage device, the charge holding portions of the memory device are formed independently of the gate insulating film and disposed on both sides of the gate electrode. Therefore, the memory storage operation of two-bit or more information is enabled. Further, because the charge holding portions are separated from each other by the gate electrode, interference therebetween in writing can effectively be suppressed. Furthermore, the memory function implemented by the charge holding portions and the transistor operation function implemented by the gate insulating film are separated. Thus, the thickness of the gate insulating film is reducible, so that the short channel effect can be suppressed. Accordingly, miniaturization of the device is facilitated.

In any one of the above examples of the memory device as the semiconductor storage device, since the charge holding portions are located in a direction in which high-energy electric charges proceed in the write operations, the injection efficiency of electric charges into the charge holding portions is markedly improved, so that the writing speed can greatly be improved. It is also possible to reduce a writing current to thereby reduce the power consumption in write operations.

In the following embodiments, various preferred configurations of a memory device constituting the semiconductor storage device of the present invention will be described.

(Embodiment 2)

Figure 11:
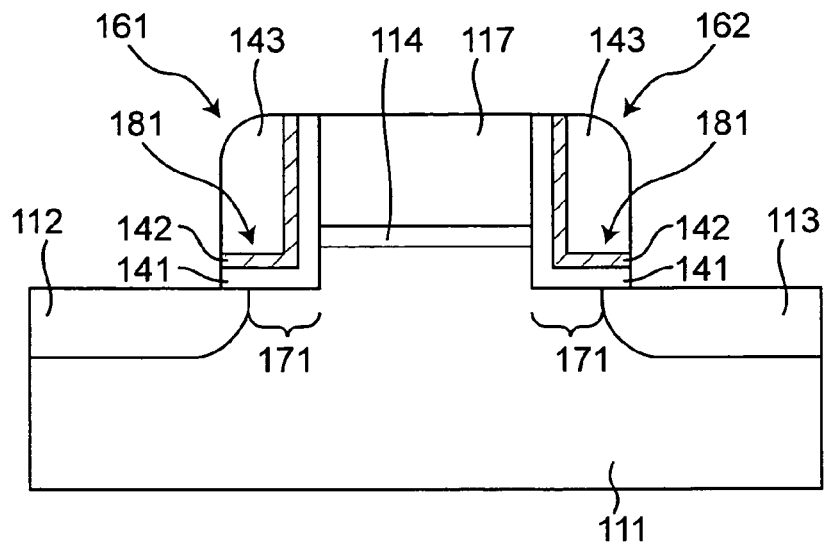
FIG. 11 is a schematic cross-sectional view of essential parts of a semiconductor storage device according to Embodiment 2 of this invention.

In a memory device (semiconductor memory storage device) of Embodiment 2, as shown in FIG. 11, each charge holding portion 161, 162 is composed of a region for holding electric charges and a region for obstructing release or escape of electric charges. The region for holding electric charges is a region that stores electric charges, which may be a film having a function of holding electric charges. The region for obstructing release of electric charges may be given by a film having a function of obstructing release of electric charges.

The charge holding portion 161, 162 has, for example, an ONO (Oxide Nitride Oxide) structure. More specifically, the charge holding portions 161, 162 are each structured in the state that a silicon nitride film 142 is interposed between a silicon oxide film 141 and a silicon oxide film 143. Here, the silicon nitride film 142 implements a function of holding electric charges. The silicon oxide films 141, 143 implement a function of obstructing release of the electric charges stored in the silicon nitride film.

Also, the regions (silicon nitride films 142) for holding electric charges in the charge holding portions 161, 162 overlap with diffusion layer regions 112, 113, respectively, in a channel length direction. Herein, the term "overlap" is used to refer to the state that at least part of the region (silicon nitride film 142) for holding electric charges lies on at least part of the diffusion layer region 112, 113. Reference numeral 171 indicates offset regions 171 generated by offsetting the diffusion layer regions 112, 113 outwardly in the channel length direction relative to a gate electrode 117. Though not shown in the drawing, an uppermost surface area of a semiconductor substrate 111 under a gate insulating film 114 (a portion in the semiconductor substrate 111 opposite to the gate insulating film 114) serves as a channel region.

Next, description will be given of an effect of overlapping of the region 142 for holding electric charges in the charge holding portions 161, 162 and the diffusion layer regions 112, 113.

Figure 12:
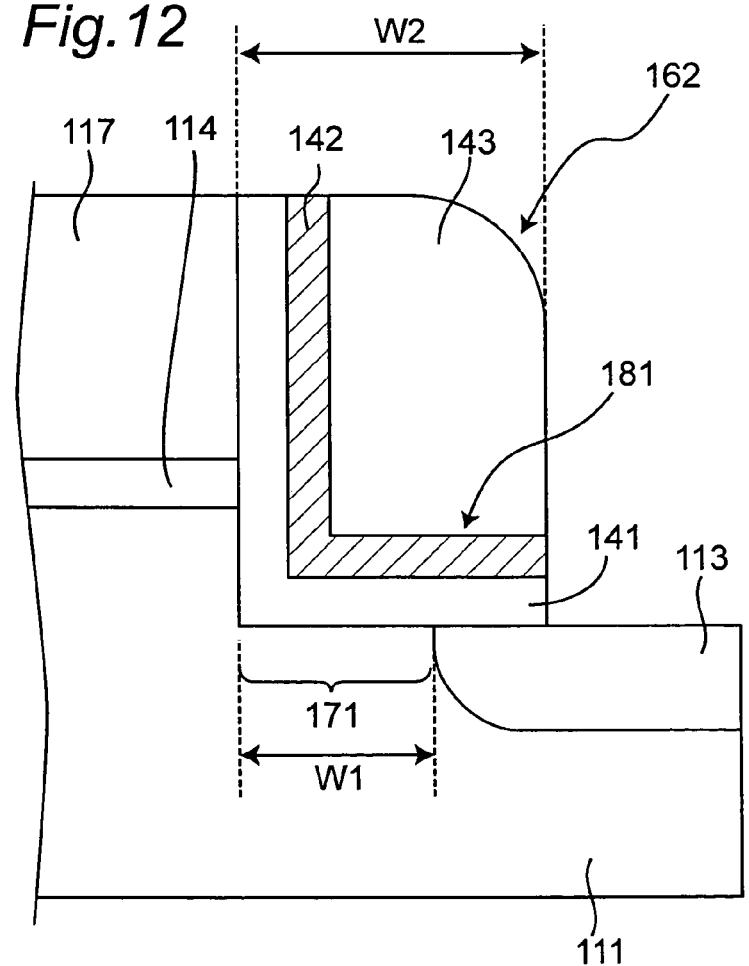
FIG. 12 an enlarged view of a part of FIG. 11.

FIG. 12 is an enlarged view showing the vicinity of the charge holding portion 162 that is one of the charge holding portions 161, 162 shown in FIG. 11. In the figure, reference symbol W1 denotes an offset amount between the gate insulating film 114 and the diffusion layer region 113. Also, reference symbol W2 denotes the width of the charge holding portion 162 in the channel length direction of the gate electrode. In the memory device shown in the figure, since an edge of the silicon nitride film 142 on the side away from the gate electrode 117 in the charge holding portion 162 is aligned with an edge of the charge holding portion 162 on the side away from the gate electrode 117, the width of the charge holding portion 162 is defined as W2. An overlap amount between the charge holding portion 162 and the diffusion layer region 113 is represented by an expression of W2−W1. What is particularly important is that the silicon nitride film 142 in the charge holding portion 162 overlaps with the diffusion layer region 113, that is, the silicon nitride film 142 is configured such that the relation of W2>W1 is satisfied.

Figure 13:
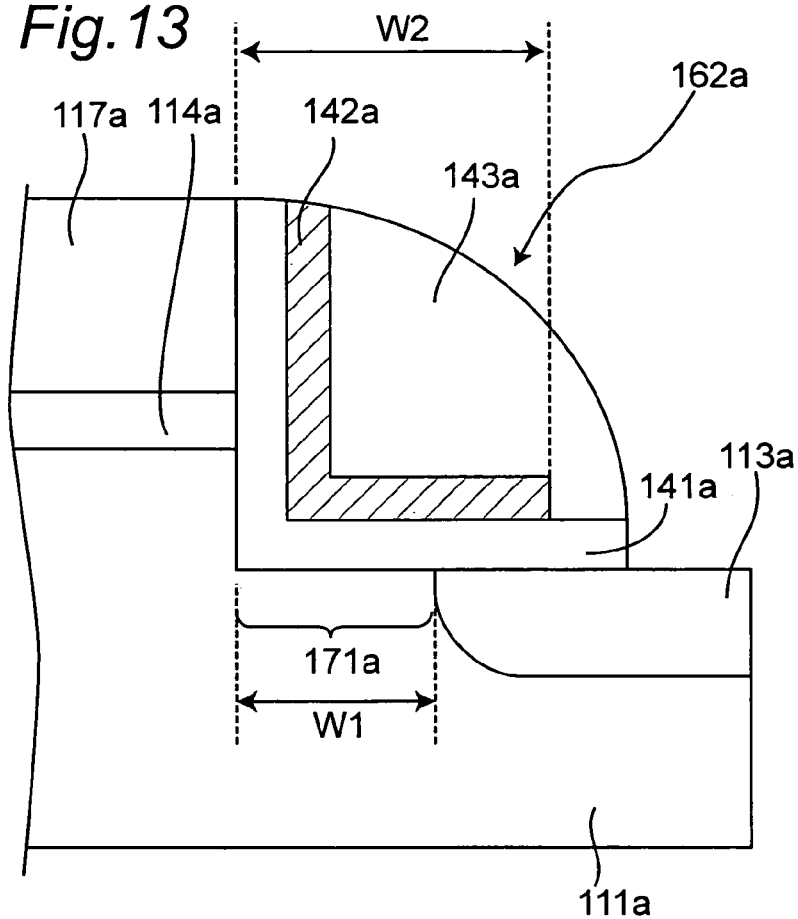
FIG. 13 is an enlarged view of a part of a modification to FIG. 11.

In the case where the edge of the silicon nitride film 142a on the side away from the gate electrode 117a in the charge holding portion 162a does not coincide with the edge of the charge holding portion 162a on the side away from the gate electrode 117a as shown in FIG. 13, W2 may be defined as the width from the edge of the gate electrode 117a to the edge of the silicon nitride film 142a on the side away from the gate electrode 117a. In FIG. 13, the portions of the memory device are denoted by adding a character "a" to those numerals denoting the corresponding portions in FIG. 12.

Figure 14:
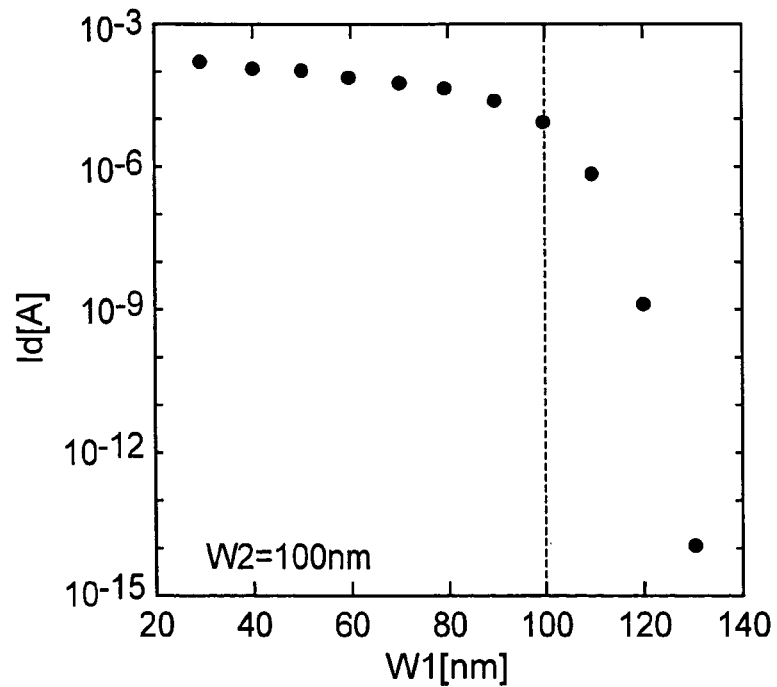
FIG. 14 is a graph showing electrical characteristics of a semiconductor storage device having the same construction as the semiconductor storage device of FIGS. 11 and 12 except that a bottom surface of the charge holding portion is at the same level as that of an interface between a gate insulating film and a semiconductor substrate.

FIG. 14 shows a drain current Id in a semiconductor storage device having the same structure as the semiconductor storage device shown in FIGS. 11, 12, except that a lower face of each charge holding portion is at the same level as an interface of the gate insulating film and the semiconductor substrate, with the width W2 of the charge holding portion 162 being fixed to 100 nm and with the offset amount W1 being varied. Herein, the drain current was obtained by device simulation performed under the conditions that the charge holding portion 162 is in an erased state (a state in which holes are stored), and that the diffusion layer regions 112, 113 are used as a source electrode and a drain electrode, respectively. It has been confirmed that the electrical characteristics in various embodiments of this invention are similar to those shown in FIG. 14. Thus, it should be understood that the following description can apply to all the embodiments of this invention.

As is apparent from FIG. 14, with W1 being 100 nm or more (i.e., when the silicon nitride film 142 and the diffusion layer region 113 do not overlap), the drain current shows rapid reduction. Since a drain current value is almost in proportion to a read operation speed, memory performance rapidly deteriorates when W1 is 100 nm or more. In the range where the silicon nitride film 142 and the diffusion layer region 113 overlap, the drain current shows mild reduction. Therefore, it is preferable that the silicon nitride film 142 that is a film having a function of holding electric charges at least partially overlaps with the corresponding diffusion layer region (source/drain region) 112, 113.

Based on the above-described result of the device simulation, memory cell arrays were manufactured with W2 being fixed to a design value of 100 nm, and W1 being set to 60 nm and 100 nm as design values. When W1 is 60 nm, the silicon nitride film 142 overlaps with the diffusion layer region 112, 113 by 40 nm as a design value, and when W1 is 100 nm, there is no overlap as a design value.

As a result of measuring read times of these memory cell arrays and comparing them in worst cases considering dispersion or variations, it was found out that the case where W1 was 60 nm as a design value was 100 times faster in readout access time. From a practical standpoint, it is preferable that the read access time is 100 nanoseconds or less per bit. It was found out, however, that this condition is never satisfied in the case of W1=W2. It was also found out that W2−W1>10 nm is more preferable in consideration of the manufacturing variation.

For reading information stored in the charge holding portion 161 (region 181), it is preferable to set the diffusion layer region 112 as a source electrode and the diffusion layer region 113 as a drain region, as in Embodiment 1, and to form a pinchoff point in the channel region on the side closer to the drain region. More specifically, in reading information stored in one of the two charge holding portions 161, 162, the pinchoff point is preferably formed in a region closer to the other charge holding portion of the channel region. This makes it possible to detect stored information in one charge holding portion 161, for example, with good sensitivity regardless of the storage condition of the other charge holding portion 162, resulting in large contribution to implementation of two-bit operation.

In the case of storing information only in one of the two charge holding portions 161, 162, or in the case of using these two charge holding portions 161, 162 in the same storing condition, a pinchoff point does not necessarily need to be formed in read operations.

Although not shown in FIG. 11, a well region (P type well in the case of N-channel devices) is preferably formed at the surface of the semiconductor substrate 111. Forming the well region facilitates control of electrical characteristics (withstand voltage, junction capacitance, and short channel effect) while maintaining the impurity concentration of the channel region optimum for memory operations (rewrite operation and read operation).

From the viewpoint of improving the memory holding characteristic, the charge holding portion 161, 162 preferably incorporates a charge holding film having a function of holding electric charges, and an insulating film. This embodiment uses the silicon nitride film 142 as a charge holding film having levels for trapping electric charges, and the silicon oxide films 141, 143 as insulating films having a function of preventing the electric charges stored in the charge holding film from dissipating. The charge holding portion 161, 162 having the charge holding film and the insulating film makes it possible to prevent electric charges from dissipating and to thereby improve the holding characteristics. Further, compared with the charge holding portion 161, 162 composed of only a charge holding film, it becomes possible to appropriately decrease the volume of the charge holding film. Appropriate decrease of the volume of the charge holding film makes it possible to restrain the movement of electric charges in the charge holding film and thereby to control occurrence of changes in characteristics due to the movement of electric charges during the memory holding.

Also, it is preferable that the charge holding portion 161, 162 contains a charge holding film having a portion disposed approximately parallel to the top surface of the gate insulating film 114. In other words, it is preferable that an upper face of the charge holding film in the charge holding portion 161, 162 is disposed so as to be at a constant distance from an upper face of the gate insulating film 114.

Figure 15:
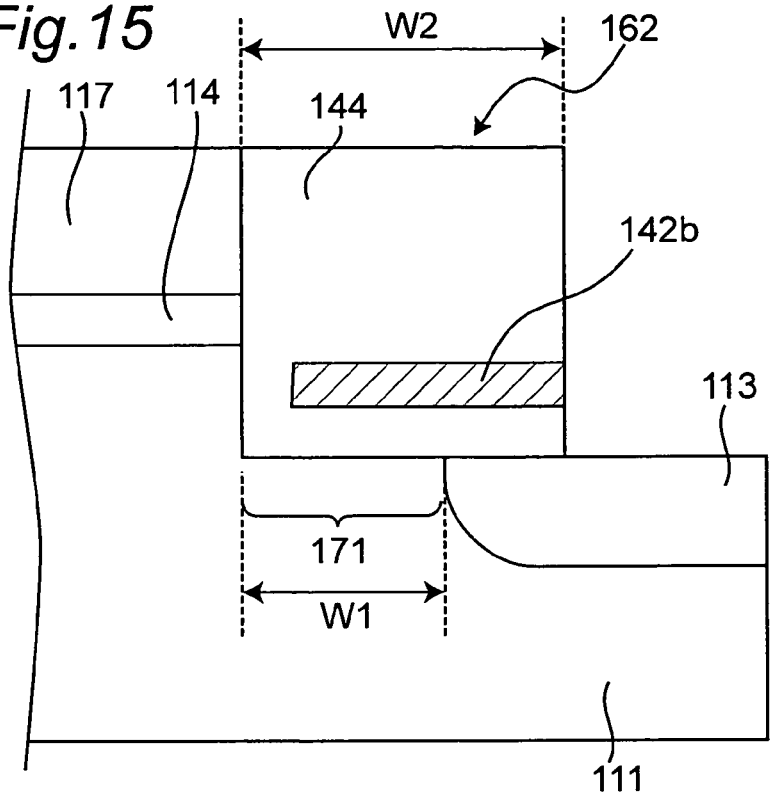
FIG. 15 is a schematic cross-sectional view of essential parts of a modified example according to Embodiment 2 of this invention.

More particularly, as shown in FIG. 15, a charge holding film 142b (e.g., silicon nitride film) in the charge holding portion 162 has a face approximately parallel to the surface of the gate insulating film 114. In other words, the charge holding film 142b is preferably formed to have an equal distance from the level corresponding to the surface of the gate insulating film 114. The constitution of the charge holding film 142b corresponds to the region 181 that is a portion having a face approximately parallel to the gate insulating film 114 in the silicon nitride film 142 shown in FIG. 12.

The presence of the charge holding film 142b approximately parallel to the surface of the gate insulating film 114 in the charge holding portion 162 makes it possible to effectively control formation of an inversion layer in the offset region 171 with use of an electric charge amount stored in the charge holding film 142b, thereby enabling increase of memory effect. Also, by placing the charge holding film 142b approximately parallel to the surface of the gate insulating film 114, change of the memory effect is kept relatively small even when there are variations in the offset amount (W1), thus enabling restraint of memory effect variation. In addition, movement of electric charges toward the upper side of the charge holding film 142b is controlled, and therefore characteristics change due to the movement of electric charges during memory holding can be restrained.

Furthermore, the charge holding portion 161, 162 preferably contains an insulating film (e.g., a portion of the silicon oxide film 144 on the offset region 171) that separates the charge holding film 142b approximately parallel to the surface of the gate insulating film 114 from the channel region (or the well region). This insulating film corresponds to portions in the silicon oxide films 141, 143 approximately parallel to the surface of the gate insulating film 114 in the memory device shown in FIG. 11. This insulating film restrains dissipation of the electric charges stored in the charge holding film 142b, thereby contributing to obtaining a memory device (semiconductor storage device) with good holding characteristics.

It is noted that controlling the film thickness of the charge holding film 142b as well as controlling the film thickness of the insulating film under the charge holding film 142b (a portion of the silicon oxide film 144 on the offset region 171) to be constant makes it possible to keep the distance from the surface of the semiconductor substrate to the electric charges stored in the charge holding film 142b approximately constant. More particularly, the distance from the surface of the semiconductor substrate 111 to the electric charges stored in the charge holding film 142b can be controlled to be within the range of from a minimum film thickness value of the insulating film under the charge holding film 142b to the sum of a maximum film thickness of the insulating film under the charge holding film 142b and a maximum film thickness of the charge holding film 142b. Consequently, the density of electric lines of force generated by the electric charges stored in the charge holding film 142b becomes roughly controllable, and therefore variation in the degree of memory effect of the memory devices can be minimized.

(Embodiment 3)

Figure 16:
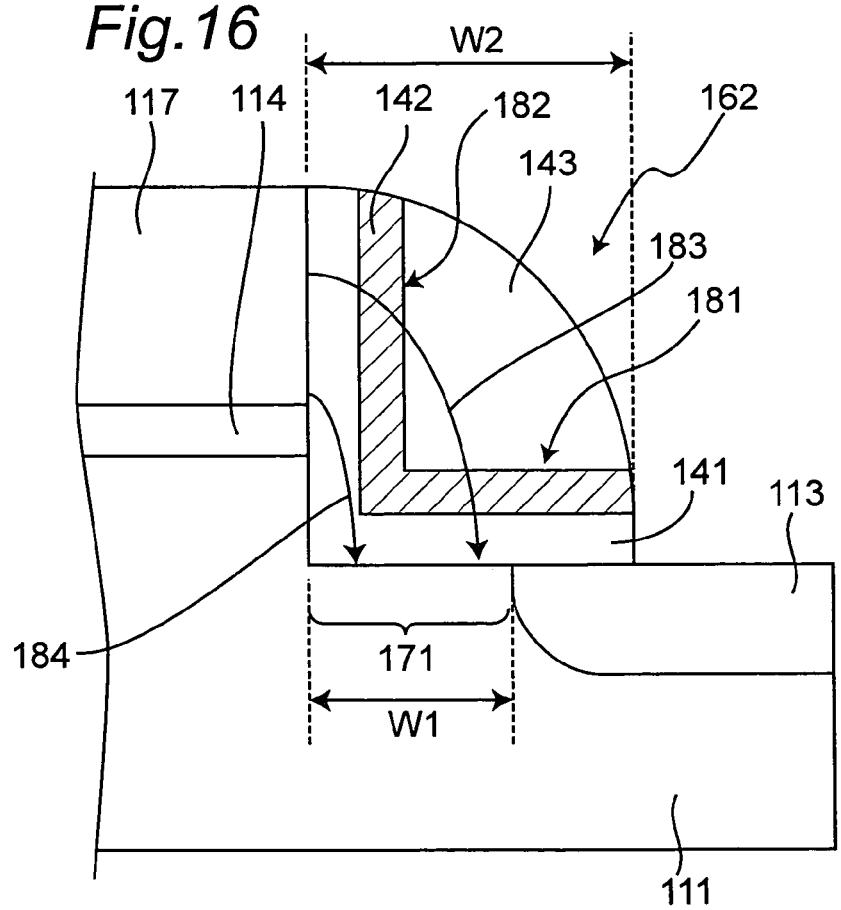
FIG. 16 is a schematic cross-sectional view of essential parts of a semiconductor storage device according to Embodiment 3 of this invention.

In a memory device of Embodiment 3, a silicon nitride film (charge holding film) 142 in the charge holding portion 161, 162 has an approximately uniform film thickness as shown in FIG. 16. Further, the charge holding film 142 includes a portion (region 181) disposed approximately parallel to a top surface of the gate insulating film 114 and a portion (region 182) approximately parallel to a side surface of the gate electrode 117.

When a positive voltage is applied to the gate electrode 117, an electric line of force in the charge holding portion 162 passes the silicon nitride film 142 totally twice (through the first portion 181 and the second portion 182) as shown with arrow 183. It is noted that when a negative voltage is applied to the gate electrode 117, the direction of the electric line of force is reversed.

Herein, a relative permittivity, or dielectric constant of the silicon nitride film 142 is approx. 6, while a dielectric constant of silicon oxide films 141, 143 is approx. 4. Eventually, in the charge holding portion 161, 162, an effective dielectric constant in the direction of electric line of force 183 becomes larger than that in the case where only the charge holding film 142a corresponding to the region 181 is present, which makes it possible to decrease the potential difference between both edges of the electric line of force. More specifically, a large part of the voltage applied to the gate electrode 117 is used to reinforce electric fields in the offset region 171.

In the memory device, electric charges are injected into the silicon nitride film 142 in rewrite operations because generated electric charges are pulled by electric fields in the offset region 171. As a consequence of the charge holding film 142 including the region 182, increased electric charges are injected into the charge holding portion 162 in rewrite operations, thereby increasing a rewrite speed.

In the case where the silicon oxide film 143 is replaced with a silicon nitride film, more specifically, in the case where the upper surface of the silicon nitride film (charge holding film) is not at a constant height relative to the surface of the gate insulating film 114, movement of electric charges toward upper side of the silicon nitride film becomes outstanding, and holding characteristics are deteriorated.

Instead of silicon nitride, the charge holding film is more preferably formed from high-dielectric substances such as hafnium oxide having an extremely large dielectric constant, or relative permittivity.

Further, the charge holding portion 161, 162 more preferably includes an insulating film (a portion of the silicon oxide film 141 on the offset region 171) that separates the charge holding film (region 181) approximately parallel to the surface of the gate insulating film 114 from the channel region (or the well region). This insulating film restrains dissipation of the electric charges stored in the charge holding film (silicon nitride film 142), thereby enabling further improvement of holding characteristics.

Also, the charge holding portion 161, 162 more preferably includes an insulating film (a portion of the silicon oxide film 141 in contact with the gate electrode 117) that separates the gate electrode 117 from the charge holding film (region 182) extending in the direction approximately parallel to the side surface of the gate electrode 117. This insulating film prevents injection of electric charges from the gate electrode 117 into the charge holding film (silicon nitride film 142) to thereby prevent change of electrical characteristics, which increases reliability of the memory device (semiconductor storage device).

Further, in the memory device of the embodiment, similar to Embodiment 2, it is preferable that the film thickness of a portion of the silicon oxide films 141, 143 between the charge holding film 142 and the semiconductor substrate 111 (a portion of the silicon oxide film 141 on the offset region 171) is controlled to be constant, and that the film thickness of a portion of the silicon oxide films 141, 143 between the silicon nitride film 142 and the gate electrode 117 (a portion of the silicon oxide film 141 in contact with the gate electrode 117) is controlled to be constant. Consequently, the density of electric lines of force generated by the electric charges stored in the charge holding film 142 becomes roughly controllable, and leakage of electric charges can be prevented.

(Embodiment 4)

In this embodiment, a memory device in which a gate electrode 117, charge holding portions 161, 162 and the distance between source/drain regions (the distance between diffusion layer regions 112, 113) have been optimized will be described.

Figure 17:
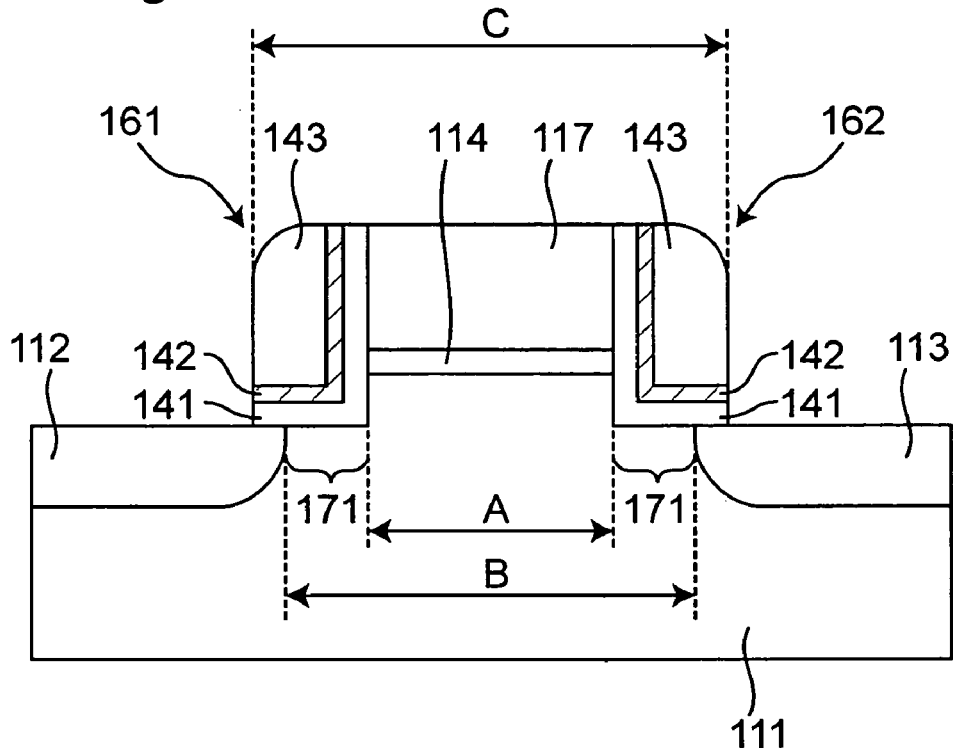
FIG. 17 is a schematic cross-sectional view of essential parts of a semiconductor storage device according to Embodiment 4 of this invention.

In the memory device shown in FIG. 17, reference symbol A denotes a gate electrode length in the channel length direction, reference symbol B denotes the distance (channel length) between the diffusion layer regions (source and drain regions) 112, 113, and reference symbol C denotes the distance between outer edges of the charge holding portions 161, 162, more specifically a distance in the channel length direction from the edge (outer edge) on the side away from the gate electrode 117 of a silicon nitride film 142 (charge holding film) in one charge holding portion 161 to the edge (outer edge) on the side away from the gate electrode 117 of a silicon nitride film 142 (charge holding film) in the other charge holding portion 162.

In the relationship among A–C, first, it is preferable that the relationship of B<C holds. In the channel region, there is an offset region 171 between a portion under the gate electrode 117 (a region in the semiconductor substrate 111 opposite to the gate electrode 117) and each of the source/drain regions 112, 113. Since B<C, the electric charges stored in the charge holding portions 161, 162 (silicon nitride films 142) effectively vary invertibility of the entire offset region 171. As a result, memory effect is enhanced, and a high-speed read operation is particularly enabled.

Also, when the gate electrode 117 and the diffusion layer regions (source/drain regions) 112, 113 are offset relative to each other, that is, when an equation A<B is satisfied, invertibility of the offset region 171 when a voltage is applied to the gate electrode 117 is largely changed by an electric charge amount stored in the charge holding portion 161, 162. Consequently, the memory effect increases and the short channel effect can be reduced. However, as long as the memory effect is produced, the offset region 171 is not necessarily required. Even when the offset region 171 is not present, if the impurity concentration in the source/drain regions 112, 113 is sufficiently small, the memory effect can still be seen in the charge holding portions 161, 162 (silicon nitride film 142).

As is apparent from the above description, the state of A<B<C is most preferable.

(Embodiment 5)

Figure 18:
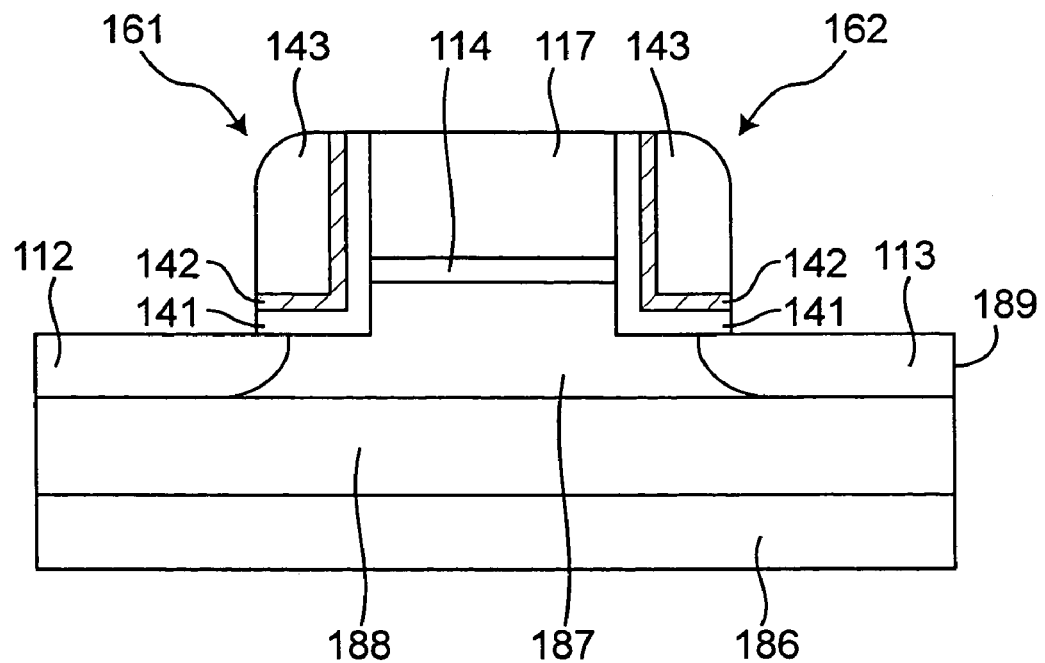
FIG. 18 is a schematic cross-sectional view of essential parts of a semiconductor storage device according to Embodiment 5 of this invention.

A memory device (semiconductor storage device) in this embodiment has essentially the same structure as that in Embodiment 2 (FIG. 11) except that in the present embodiment, the semiconductor substrate is an SOI substrate, as shown in FIG. 18.

The memory device is structured such that a buried oxide film 188 is formed on a semiconductor substrate 186, and on top of the buried oxide film 188, an SOI layer 189 is further formed. In the SOI layer 189, there are formed diffusion layer regions 112, 113, and other areas constitute a body region 187.

This memory device also brings about the effects similar to those of the semiconductor storage device in Embodiment 3. Further, since the junction capacitance between the diffusion layer regions 112, 113 and the body region 187 can be considerably reduced, it becomes possible to increase a device speed and to decrease power consumption.

(Embodiment 6)

Figure 19:
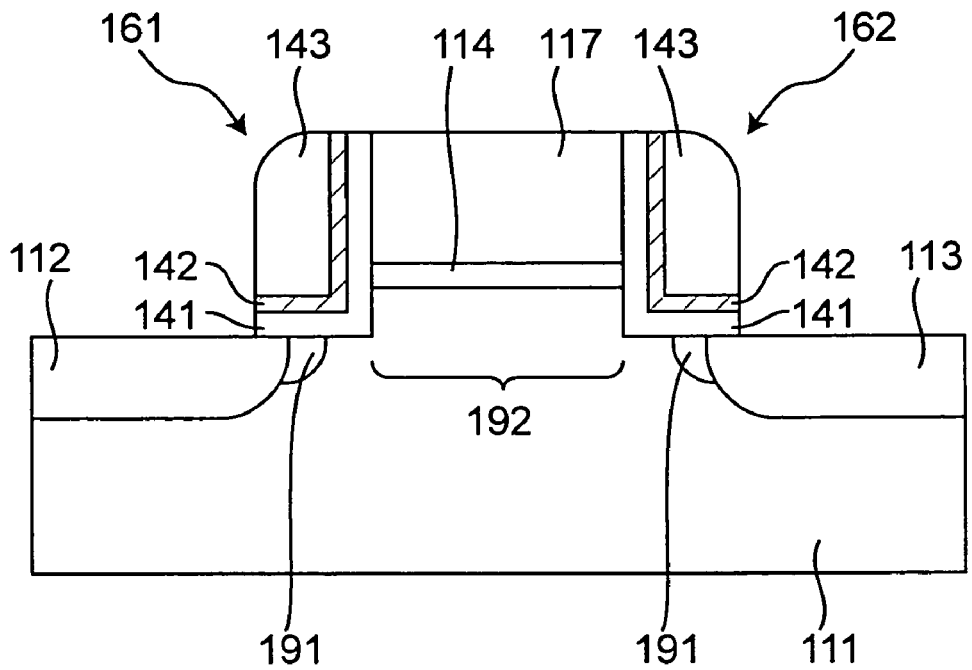
FIG. 19 is a schematic cross-sectional view of essential parts of a semiconductor storage device according to Embodiment 6 of this invention.

A memory device (semiconductor storage device) in Embodiment 6 has essentially the same structure as that in Embodiment 2 (FIG. 11), except that in Embodiment 6, P type highly-concentrated regions 191 are provided, as shown in FIG. 19, in the vicinity of diffusion layer regions (N type source/drain regions) 112, 113 at the channel side thereof.

The concentration of P type impurity (e.g., boron) in the P type highly-concentrated regions 191 is higher than the concentration of P type impurity in a region 192 between the P type highly-concentrated regions 191. An appropriate value of the P type impurity concentration in the P type highly-concentrated region 191 is, for example, around $5 \times 10^{17}$ to $1 \times 10^{19}$ cm$^{-3}$. Also, a value of the P type impurity concentration in the region 192 may be set to, for example, $5 \times 10^{16}$ to $1 \times 10^{18}$ cm$^{-3}$.

Providing the P type highly-concentrated region 191 makes the junction between the diffusion layer region 112, 113 and the semiconductor substrate 111 steep right under the charge holding portion 161, 162. The junction being steep means that the impurity concentration on both sides of the PN junction is high and the impurity concentration gradient in the vicinity of the junction is steep, so that the potential gradient in the vicinity of the junction becomes steep.

This facilitates generation of hot carriers in write and erase operations, thereby enabling reduction of voltages in write operations and erase operations or implementing high-speed write operations and erase operations. Further, since the impurity concentration in the region 192 is relatively low, a threshold value when the memory device is in erased state is small, so that the drain current becomes large. Consequently, a read speed is increased. This makes it possible to provide a memory device (semiconductor storage device) having low rewrite voltage or a high rewrite speed, and having a high read speed.

Also, as shown in FIG. 19, by providing the P type highly-concentrated region 191 in a position adjacent to the diffusion layer region (source/drain region) 112, 113 and opposite to the charge holding portion 161, 162 (not a position opposite to the gate electrode 117), a threshold value of the entire transistor shows considerable increase. The degree of this increase is extremely larger than that in the case where the P type highly-concentrated region 191 is present right under the gate electrode 117 (namely, in a portion in the semiconductor substrate 111 opposite to the gate electrode 117). When write electric charges (which are electrons in the case where the transistor is of N channel type) are stored in the charge holding portions 161, 162, the difference in the threshold value becomes larger.

When enough erasure electric charges (holes in the case where the transistor is of N channel type) are stored in the charge holding portions 161, 162, a threshold value of the entire transistor is decreased down to a value determined by the impurity concentration in the channel region (region 192) under the gate electrode 117. More specifically, the threshold value in the erased state does not depend on the impurity concentration in the P type highly-concentrated region 191, whereas the threshold value in the written, or programmed state is largely influenced thereby. Therefore, disposing the P type highly-concentrated region 191 under the charge holding portions 161, 162 (namely, in portions of the semiconductor substrate 111 opposite to the charge holding portions 161, 162) and adjacent to the diffusion layer region (source/drain region) 112, 113 largely changes the threshold value only in the programmed state, thereby enabling remarkable increase of the memory effect (that is, a difference of threshold values in the programmed state and the erased state).

(Embodiment 7)

Figure 20:
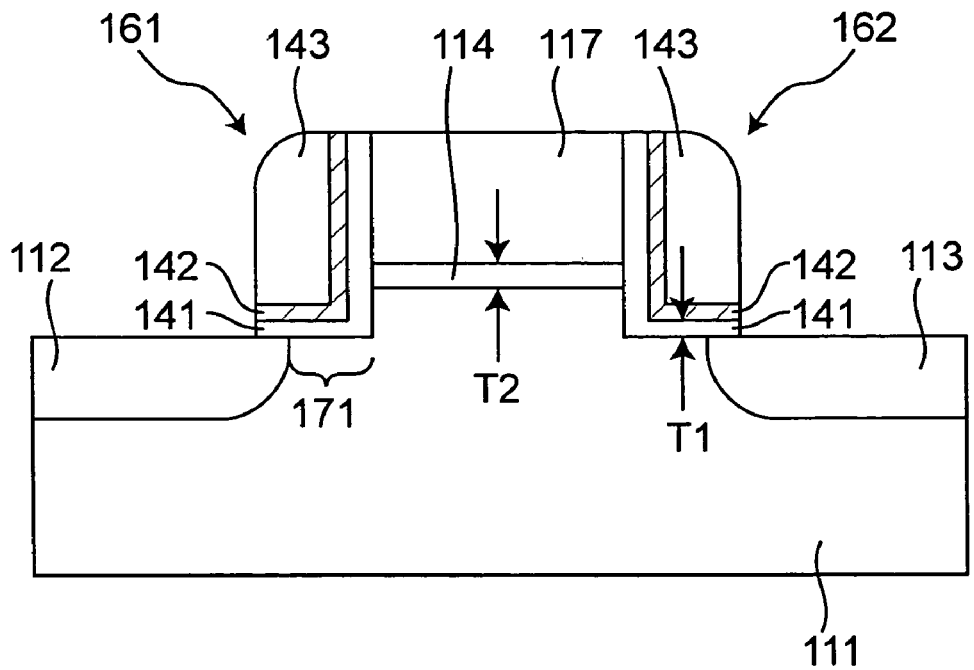
FIG. 20 is a schematic cross-sectional view of essential parts of a semiconductor storage device according to Embodiment 7 of this invention.

A memory device (semiconductor storage device) in Embodiment 7 has essentially the same structure as that in Embodiment 2 (FIG. 11), except that the thickness T1 of the insulating film (silicon oxide film 141) that separates the charge holding film (silicon nitride film 142) of the charge holding portion 161, 162 from the channel region or the well region is smaller than the thickness T2 of the gate insulating film 114, as shown in FIG. 20.

The gate insulating film 114 has a lower limit of the thickness T2 because of the request for withstand voltage in memory rewrite operations. However, the thickness T1 of the insulating film (silicon oxide film 141) in the change holding portion 161, 162 can be smaller than T2 regardless of the request for withstand voltage, or electric strength.

In the storage device in this embodiment, the thickness T1 of the insulating film (silicon oxide film 141) has high design freedom as stated above because of the following reason.

In the memory device (semiconductor storage device) in this embodiment, the insulating film (silicon oxide film 141) that separates the charge holding film (silicon nitride film 142) of the charge holding portion 161, 162 from the channel region or the well region is not placed between the gate electrode 117 and the channel region or well region. Consequently, the insulating film (silicon oxide film 141) does not receive direct influence from the high electric fields that act upon a region between the gate electrode 117 and the channel region or the well region, but receives influence from relatively weak electric fields horizontally expanding from the gate electrode 117. As a result, despite the request for withstand voltage, it becomes possible to make the thickness T1 of the silicon oxide film 141 smaller than the thickness T2 of the gate insulating film 114.

Contrary to this, for example in an EEPROM as typified by a flash memory, an insulating film that separates a floating gate from the channel region or the well region is disposed between a gate electrode (control gate) and the channel region or the well region, so that high electric fields of the gate electrode act directly upon the insulating film. In the EEPROM, therefore, the thickness of the insulating film that separates the floating gate from the channel region or the well region has a critical value, which hinders optimization of the functions of the memory device.

As is apparent from the above, in the memory device of this embodiment, an essential reason of high freedom of the thickness T1 of the insulating film (silicon oxide film 141) is that the insulating film (silicon oxide film 141) that separates the charge holding film (silicon nitride film 142) of the charge holding portion 161, 162 from the channel region or the well region is not interposed between the gate electrode 117 and the channel region or the well region.

In the memory device, decreasing the thickness T1 of the insulating film (silicon oxide film 141) facilitates injection of electric charges into the charge holding portions 161, 162, i.e., the charge holding film (silicon nitride film 142), decreases voltage for write operations and erase operations, or enables high-speed write operations and erase operations. In addition, since an increased electric charges are induced in the channel region or the well region when electric charges are stored in the charge holding film (silicon nitride film 142), an increased memory effect can be achieved.

Some electric lines of force in the charge holding portion 161, 162, which have a short length, do not pass the silicon nitride film 142 as shown with arrow 184 in FIG. 16. Since electric field strength is relatively large on such a short electric line of force 184, the electric fields along the electric line of force 184 plays an important role in rewrite operations.

In the case where the thickness T1 of the silicon oxide film 141 is reduced as in the memory device of the present embodiment, the silicon nitride film 142 moves to the lower side of the figure (i.e., approaches the semiconductor substrate 111), so that the electric line of force 184 passes the silicon nitride film 142. As a consequence, an effective dielectric constant in the charge holding portion 161, 162 along the electric line of force 184 becomes large, which makes it possible to make a potential difference between both ends of the electric line of force 184 smaller. Therefore, most part of voltage applied to the gate electrode 117 is used to strengthen the electric fields in the offset region 171, thereby implementing high-speed write operations and erase operations.

As is clear from the above, satisfying the relationship of T1<T2 makes it possible to decrease voltages in write operations and erase operations or implement high-speed write operations and erase operations, without deteriorating the electrical strength of the memory, and to enable further increase of memory effect.

It is noted that the thickness T1 of the insulating film is preferably at least 0.8 nm, which is a limit at which uniformity in a manufacturing process and/or a certain level of film quality is maintained and at which holding characteristics do not suffer extreme deterioration.

Next, a preferred example of the application of the memory device of the present embodiment will be described.

More specifically, in the case of a liquid crystal driver LSI which has a severe design rule and requires high withstand voltage, a voltage of maximum 15 V to 18 V is necessary for driving liquid crystal panel TFTs (thin-film transistors). Thus, it is not possible to make the gate oxide film (gate insulating film) thinner with the LSI.

In the case of mounting nonvolatile memories (memory devices) of the present embodiment as an image adjuster together with other devices on the liquid crystal driver LSI, the memory device of the present invention enables optimum design of the thickness of the insulating film (silicon oxide film 141) that separates the charge holding film (silicon nitride film 142) from the channel region or the well region independently of the thickness of the gate insulating film 114. For example, in a memory cell with a gate electrode length (word line width) of 250 nm, T1 and T2 may be set like T1=20 nm and T2=10 nm, fulfilling a storage device with good write efficiency.

Short channel effect is not generated even though T1 is larger than that of normal logic transistors because the diffusion layer region (source/drain region) 112, 113 is offset from the gate electrode 117.

(Embodiment 8)

Figure 21:
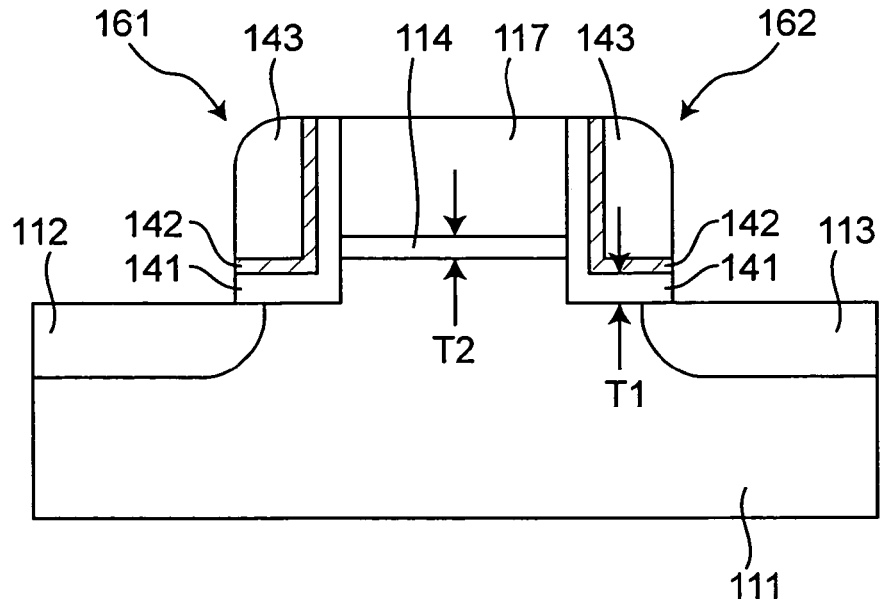
FIG. 21 is a schematic cross-sectional view of essential parts of a semiconductor storage device according to Embodiment 8 of this invention.

A memory device (semiconductor storage device) in Embodiment 8 has essentially the same structure as that in Embodiment 2 (FIG. 11) except that the thickness T1 of the insulating film (silicon oxide film 141) that separates the charge holding film (silicon nitride film 142) of the charge holding portion 161, 162 from the channel region or the well region is larger than the thickness T2 of the gate insulating film 114, as shown in FIG. 21.

The gate insulating film 114 has an upper limit of the thickness T2 because of the request for prevention of the short channel effect of the memory device. However, the thickness T1 of the insulating film (silicon oxide film 141) of the charge holding portion 161, 162 is allowed to be larger than T2 regardless of the request for prevention of the short channel effect. More specifically, as miniaturization scaling proceeds (the gate insulating film 114 becomes thinner), the thickness of the insulating film (silicon oxide film 141) that separates the charge holding film (silicon nitride film 142) from the channel region or the well region can be optimally designed independently of the thickness of the gate insulating film 114. That is, the charge holding portions 161, 162, advantageously, will not be an obstacle to the scaling down.

In the memory device (semiconductor storage device) of this embodiment, the thickness T1 of the insulating film (silicon oxide film 141) has high design freedom as stated above because, as is already described, the insulating film (silicon oxide film 141) that separates the charge holding film (silicon nitride film 142) of the charge holding portion 161, 162 from the channel region or the well region is not interposed between the gate electrode 117 and the channel region or the well region. As a result, despite the request for prevention of short channel effect to the gate insulating film 114, it becomes possible to make the thickness T1 of the silicon oxide film 141 larger than the thickness T2 of the gate insulating film 114.

Increasing the thickness T1 of the insulating film (silicon oxide film 141) makes it possible to prevent dissipation of the electric charges stored in the charge holding portions 161, 162 to thereby improve holding characteristics of the memory. Therefore, setting the thickness T1 of the insulating film and the thickness T2 of the gate insulating film 114 as T1>T2 enables improvement of the holding characteristics without deteriorating the short channel effect of the memory. It is noted that the thickness T1 of the insulating film (silicon oxide film 141) is preferably 20 nm or less in consideration of reduction of a rewrite speed.

Next, a preferred example of the application of the memory device of the present embodiment will be described.

A conventional nonvolatile memory as typified by a flash memory is structured such that a selection gate electrode constitutes a write/erase gate electrode, and a gate insulating film (including a floating gate) associated with the write/ erase gate electrode serves also as an electric charge storage film. It follows that the request for miniaturization or scaling down (Note that thinning of the insulating film is essential for restraining the short channel effect) conflicts with the request for securing reliability (Note that in order to control leakage of stored electric charges, the thickness of the insulating film that separates the floating gate from the channel region or the well region can be decreased down to approx. 7 nm, but should not be decreased more.) Therefore, miniaturization of such a device is difficult. In fact, according to ITRS (International Technology Roadmap for Semiconductors), miniaturization of a physical gate length down to approx. 0.2 micron or lower is not yet in sight.

In contrast, in the memory device of the present embodiment, independent designing of T1 and T2 is available as described above, and therefore miniaturization becomes possible. In the present invention, for example, in a memory cell with a gate electrode length (word line width) of 45 nm, T1 and T2 were independently set as T2=4 nm and T1=7 nm, fulfilling a memory device free from generation of the short channel effect.

Short channel effect is not generated even though T2 is set larger than that of normal logic transistors, because the diffusion layer region (source/drain region) 112, 113 is offset, or displaced away from the gate electrode 117. Also, since the diffusion layer region (source/drain region) 112, 113 is offset from the gate electrode 117 in the memory device of the present embodiment, miniaturization is further facilitated, compared with normal logic transistors.

Summarizing the above, according to the memory device of the present invention, since an electrode for helping write and erase operations, namely gate electrode 117, is not present above the charge holding portion 161, 162, the insulating film (silicon oxide film 141) that separates the charge holding film (silicon nitride film 142) from the channel region or the well region does not receive an action of high electric fields that would occur between the electrode and the channel region or the well region, but only receives an action of relatively weak electric fields expanding horizontally from the gate electrode. This makes it possible to fulfill a memory cell (memory device) having the gate length miniaturized more than the gate length of the logic transistors.

The following description will be made on the change of electrical characteristics of the memory device when rewritten.

Figure 22:
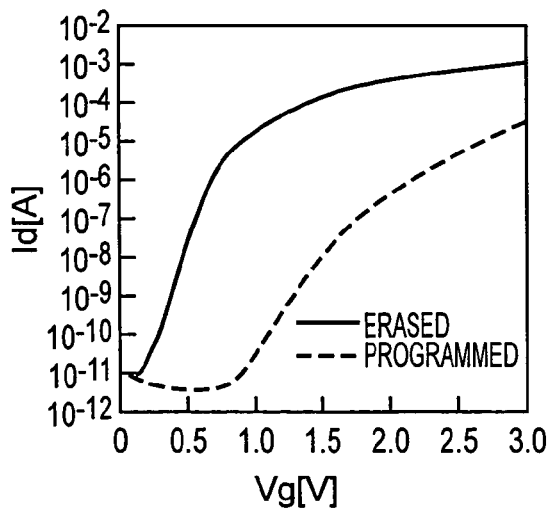
FIG. 22 is a graph showing electrical characteristics of a semiconductor storage device having the same construction as the semiconductor storage device of FIG. 21 except that a bottom surface of the charge holding portion is at the same level as that of an interface between a gate insulating film and a semiconductor substrate.

FIG. 22 is a graph showing characteristics of a drain current, Id, vs. a gate voltage, Vg, (measured values) when the electric charge amount changes in the charge holding portion 161, 162 (Here, the reference numerals in FIG. 21 are used for the sake of convenience) of an N-channel type memory device having the same structure as the semiconductor storage device shown in FIG. 21 except that a lower face of the charge holding portions is at the same level as that of an interface of the gate insulating film and the semiconductor substrate. It has been confirmed that the electrical characteristics in various embodiments of this invention are similar to those shown in FIG. 22. Thus, it should be understood that the following description applies to all the embodiments of this invention.

Figure 23:
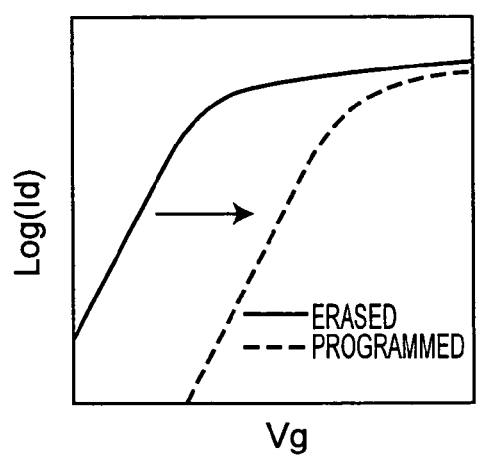
FIG. 23 is a graph showing electrical characteristics of a conventional flash memory.

As clearly shown in FIG. 22, when a write, or program operation is performed in an erased state (shown by solid line), not only does the threshold value simply rise, but a slope of the graph dramatically decreases especially in a sub-threshold region. Therefore, even in a region with relatively high gate voltages (Vg), a ratio of a drain current in the erased state to a drain current in the programmed state is large. For example, at the point of Vg=2.5V, the current ratio is still two digits or more. This characteristic is largely different from that in the case of a flash memory (FIG. 23). The emergence of the above characteristics is a phenomenon peculiar to the case where the gate electrode 117 and the diffusion layer regions 112, 113 are offset from each other and therefore the gate electric fields hardly reach the offset regions 171.

When the memory device is in a programmed state, it is extremely difficult for an inversion layer to be generated in the offset region 171 below the charge holding portion 161, 162 (portions in the semiconductor substrate 111 opposite to the charge holding portion 161, 162) even if a positive voltage is applied to the gate electrode. This causes the small slope of the Id-Vg curve in the sub-threshold region in the programmed state.

When the memory device is in an erased state, high-density electrons are induced in the offset region 171. Further, while a voltage of 0 V is applied to the gate electrode 117 (i.e., in an OFF state), electrons are not induced in the channel below the gate electrode 117 (so that an off current is small). This causes a large slope of the Id-Vg curve in the sub-threshold region in the erased state and a large increase rate of current (conductance) even in an over-threshold region.

As is clear from the above description, the semiconductor storage device of the present invention allows the drain current ratio of the erased state to the programmed state to be particularly large.

As described above, the semiconductor storage device of the present invention is mainly composed of a gate insulating film formed on a semiconductor substrate, a gate electrode formed on the gate insulating film, charge holding portions formed on the semiconductor substrate on both sides of the gate insulating film and the gate electrode that are stacked, source/drain regions (diffusion layer regions) disposed separately in the semiconductor substrate on the side opposite from the gate electrode of the charge holding portions so that each source/drain region is opposed to part of the corresponding charge holding portion, and a channel region formed in a position of the semiconductor substrate opposed to the gate electrode via the gate insulating film (between the diffusion layer regions in the semiconductor substrate).

The semiconductor storage device functions as a memory device storing four-valued or more information by storing binary or more information in one charge holding portion. However, the semiconductor storage device does not necessarily need to store four-valued or more information, but it may also function to store, for example, binary information.

It is preferable that the semiconductor storage device of the present invention is formed on a semiconductor substrate, preferably in a first conductivity type well region formed in the semiconductor substrate.

The semiconductor substrate is not limited to particular ones as far as it is applicable to semiconductor apparatuses, and it is possible to use various substrates such as substrates made from elemental semiconductors including silicon and germanium, substrates made from compound semiconductors including GaAs, InGaAs and ZnSe, SOI substrates and multilayer SOI substrates, and substrates having a semiconductor layer on a glass or plastic substrate. Among others, a silicon substrate or an SOI substrate having a silicon layer formed as a surface semiconductor layer is preferable. The semiconductor substrate or the semiconductor layer may be monocrystal (e.g., a single crystal obtained by epitaxial growth), polycrystalline, or amorphous, though a current amount flowing inside will be slightly different among them.

In the semiconductor substrate or the semiconductor layer, it is preferable that device isolation regions are formed. Elements such as transistors, capacitors and resistors, circuits composed of such elements, semiconductor devices, and an inter-layer insulating film or films may be formed in combination in a single or a multilayer structure on the semiconductor substrate or the semiconductor layer. It is noted that the device isolation regions may be formed by any of various device isolation films including a LOCOS (local oxidation of silicon) film, a trench oxide film, and an STI film.

The semiconductor substrate may be either of a P type or an N type conductivity type, and it is preferable that at least one first conductivity type (P type or N type) well region is formed in the semiconductor substrate. Acceptable impurity concentrations of the semiconductor substrate and the well region are those within the range known in the art. It is noted that in the case of using an SOI substrate as the semiconductor substrate, a well region may be formed in the surface semiconductor layer, and also a body region may be provided under the channel region.

Materials of the gate insulating film are not particularly limited as far as they are usable in typical semiconductor apparatuses. For example, insulating films including a silicon oxide film and a silicon nitride film, and high-dielectric films including aluminum oxide films, titanium oxide films, tantalum oxide films, hafnium oxide films are usable in the form of a single-layer film or a multi-layer film. Among others, the silicon oxide film is preferable. An appropriate thickness of the gate insulating film is, for example, approx. 1 to 20 nm, preferably 1 to 6 nm. The gate insulating film may be only formed right under the gate electrode, or may be formed to be larger (in width) than the gate electrode.

The gate electrode is formed on the gate insulating film in the form typically used in semiconductor apparatuses. Unless particularly specified in the embodiments, examples of the gate electrode are not particularly limited and therefore include conductive films such as polysilicon; metals including copper and aluminum; high-melting metals including tungsten, titanium, and tantalum; and silicides of high-melting metals, in the form of a single-layer or a multi-layer. An appropriate film thickness of the gate electrode is approx. 50 to 400 nm.

In the semiconductor substrate, the channel region is formed under the gate electrode (the portion opposite from the gate electrode through the gate insulating film). The channel region is preferably formed not only under the gate electrode but also under regions outside of the gate edge in longitudinal direction of the gate (a region between both of the diffusion layer regions formed in the semiconductor substrate). In the latter case where there exists a channel region which is not covered with the gate electrode, the channel region is preferably covered with the gate insulating film or charge holding portions, which will be described later.

The charge holding portion at least has a film or a region having a function of holding electric charges, or storing and holding electric charges, or a function of trapping electric charges. Materials implementing these functions include: silicon nitride; silicon; silicate glass including impurities such as phosphorus or boron; silicon carbide; alumina; high-dielectric substances such as hafnium oxide, zirconium oxide, or tantalum oxide; zinc oxide; and metals.

The charge holding portion may be formed into single-layer or multi-layer structure of: for example, an insulating film containing a silicon nitride film; an insulating film incorporating a conductive film or a semiconductor layer inside; and an insulating film containing one or more conductor dots or semiconductor dots. Among these, the silicon nitride is preferable because it can achieve a large hysteresis property by the presence of a number of levels for trapping electric charges, and has good holding characteristics in that the electric-charge holding time is long and that there hardly occurs leakage of electric charges caused by generation of leakage paths, and further because it is a material normally used in LSI process.

Use of an insulating film containing inside an insulating film having a charge holding function such as a silicon nitride film enables increase of reliability relating to memory holding. Since the silicon nitride film is an insulator, electric charges of the entire silicon nitride film will not be immediately lost even if part of the electric charges are leaked. Further, in the case of arraying a plurality of memory devices, even if the distance between the memory devices is shortened and adjacent charge holding portions come into contact with each other, information stored in each charge holding portion is not lost unlike the case where the charge holding portion is made from a conductor. Also, it becomes possible to dispose a contact plug closer to the charge holding portion, or in some cases it becomes possible to dispose the contact plug so as to overlap with the charge holding portion, which facilitates miniaturization of the memory devices.

For further increase of the reliability relating to the memory holding, the insulator having a function of holding electric charges is not necessarily needed to be in the film shape, and insulators having the function of holding an electric charge are preferably present in an insulating film in a discrete manner. More specifically, it is preferable that such insulators are dispersed like dots within a material having difficulty in holding electric charges, such as silicon oxide.

Also, use of an insulator film containing inside a conductive film or a semiconductor layer as a charge holding portion enables free control of the quantity of electric charges injected into the conductor or the semiconductor, thereby bringing about an effect of facilitating achieving a multi-valued memory cell.

Further, using an insulator film containing one or more conductor or semiconductor dots as a charge holding portion facilitates execution of write and erase by direct tunneling of electric charges, thereby bringing about an effect of reduced power consumption.

More specifically, it is preferable that the charge holding portion further contains a region that obstructs escape of electric charges or a film having a function of obstructing escape of electric charges. Materials fulfilling the function of obstructing escape of electric charges include a silicon oxide.

The charge holding portion is formed on both sides of the gate electrode directly or through an insulating film, and it is disposed on a semiconductor substrate (a well region, a body region, or a source/drain region or a diffusion layer region) directly or through the gate insulating film or the insulating film. Charge holding films on both sides of the gate electrode may be formed so as to cover the entirety or a part of side surfaces of the gate electrode directly or through the insulating film.

In the case of using a conductive film as the charge holding film, the conductive film is preferably disposed with interposition of an insulating film so that the charge holding film is not brought into direct contact with a semiconductor substrate (a well region, a body region, or a source/drain region or a diffusion layer region) or the gate electrode. This is implemented by, for example, a multi-layer structure composed of a conductive film and an insulating film, a structure in which conductive dots are dispersed in an insulating film, and a structure in which a conductive film is disposed within part of a side-wall insulating film formed on a side surface of the gate.

The charge holding portion preferably has a sandwich structure in which a film made of a first insulator for storing electric charges is interposed between a film made of a second insulator and a film made of a third insulator. Since the first insulator for storing electric charges is in the film shape, it becomes possible to increase electric charge density in the first insulator in a short period of time by injection of electric charges and also to uniform the electric charge density. In the case where the electric charge distribution in the first insulator for storing electric charges is not uniform, there is a possibility that electric charges move inside the first insulator during being held and so the reliability of the memory devices is deteriorated. Also, the first insulator for storing electric charges is separated from conductor portions (a gate electrode, a diffusion layer region, and a semiconductor substrate) with another insulating film, which may restrain leakage of electric charges and makes it possible to obtain sufficient holding time. Therefore, the above sandwich structure enables high-speed rewrite operations, increased reliability, and obtainment of sufficient holding time of the storage device.

The charge holding portion that fulfils the above conditions is more preferably structured such that the first insulator is a silicon nitride film, and the second and the third insulators are silicon oxide films. The silicon nitride film may achieve large hysteresis property by the presence of a number of levels for trapping electric charges. Also, the silicon oxide film and the silicon nitride film are preferable because they are materials used in LSI process quite typically. Further, as the first insulator, in addition to silicon nitride, there may be used such materials as hafnium oxide, tantalum oxide, and yttrium oxide. As the second and third insulators, in addition to the silicon oxide, such material as aluminum oxide may be used. It is noted that the second and third insulators may be of different materials or may be of the same material.

The charge holding portion is formed on both sides of the gate electrode, and disposed on the semiconductor substrate (a well region, a body region, or a source/drain region or a diffusion layer region).

The charge holding film contained in the charge holding portion is formed on both sides of the gate electrode directly or through an insulating film, and it is disposed on the semiconductor substrate (a well region, a body region, or a source/drain region or a diffusion layer region) directly or through the gate insulating film or the insulating film. The charge holding films on both sides of the gate electrode are preferably formed so as to cover all or part of side surfaces of the gate electrode directly or through the insulating film. In an application where the gate electrode has a recess portion on the lower edge side, the charge holding film may be formed so as to fill the entire recess portion or part of the recess portion directly or through the insulating film.

Preferably, the gate electrode is formed only on the side surface of the charge holding portion (facing only the side surface of the charge holding portion) such that the upper portion of the charge holding portion is not covered with the gate electrode. In such arrangement, it becomes possible to dispose a contact plug closer to the gate electrode, which facilitates miniaturization of the memory devices. Also, the memory devices having such simple disposition are easily manufactured, resulting in an increased yield.

The source/drain regions are disposed on the side of the charge holding portions opposed from the gate electrode as diffusion layer regions having a conductivity type opposite to that of the semiconductor substrate or of the well region. In the portion where the source/drain region is joined to the semiconductor substrate or the well region, impurity concentration is preferably sharp. This is because the sharp impurity concentration efficiently generates hot electrons and hot holes with low voltages, which enables high-speed operations with lower voltages.

The junction depth of the source/drain region is not particularly limited and so it is adjustable where necessary, according to performance and the like of a semiconductor storage device to be manufactured. It is noted that if an SOI substrate is used as the semiconductor substrate, the junction depth of the source/drain region may be smaller than the film thickness of a surface semiconductor layer, though preferably the junction depth is almost equal to the film thickness of the surface semiconductor layer.

The source/drain region may be disposed so as to overlap (partly overlap) with the edge of the gate electrode, or may be disposed so as to be offset from the edge of the gate electrode (disposed without overlapping). Particularly, it is preferable that the source/drain region is offset relative to the edge of the gate electrode. This is because in this case, when voltage is applied to the gate electrode, easiness of inversion of the offset region under the charge holding film is largely changed by an electric charge amount stored in the charge holding portion, resulting in increased memory effect and reduced short channel effect.

It is noted, however, that too much offset extremely reduces drive current between the source and the drain. Therefore, it is preferable that an offset amount, that is a distance from one edge of the gate electrode to the source or drain region closer thereto in the longitudinal direction of the gate, is shorter than the thickness of the charge holding film parallel to the longitudinal direction of the gate. What is particularly important is that at least part of the electric charge storage region in the charge holding portion overlaps with part of the source/drain region as a diffusion layer region. This is because the nature of memory devices constituting the semiconductor storage device of the present invention is to rewrite memory with an electric field crossing the charge holding portion by voltage difference between the gate electrode present only on the side wall portion of the memory function part and the source/drain region.

Part of the source/drain region may be extended to the position higher than the surface of the channel region, that is, the lower face of the gate insulating film. In this case, it is appropriate that a conductive film is laid on a source/drain region formed in the semiconductor substrate in an integrated manner with the source/drain region. Examples of the conductive film include semiconductors such as polysilicon and amorphous silicon, silicide, and the above described metals and high-melting metals. Among others, the polysilicon is preferable. Since the polysilicon is extremely larger in impurity diffusion speed than the semiconductor substrate, it is easy to shallow the junction depth of the source/drain region in the semiconductor substrate, and it is easy to control the short channel effect. In this case, it is preferable that the source/drain region is disposed such that at least part of the charge holding film is sandwiched between part of the source/drain region and the gate electrode.

Figure 24:
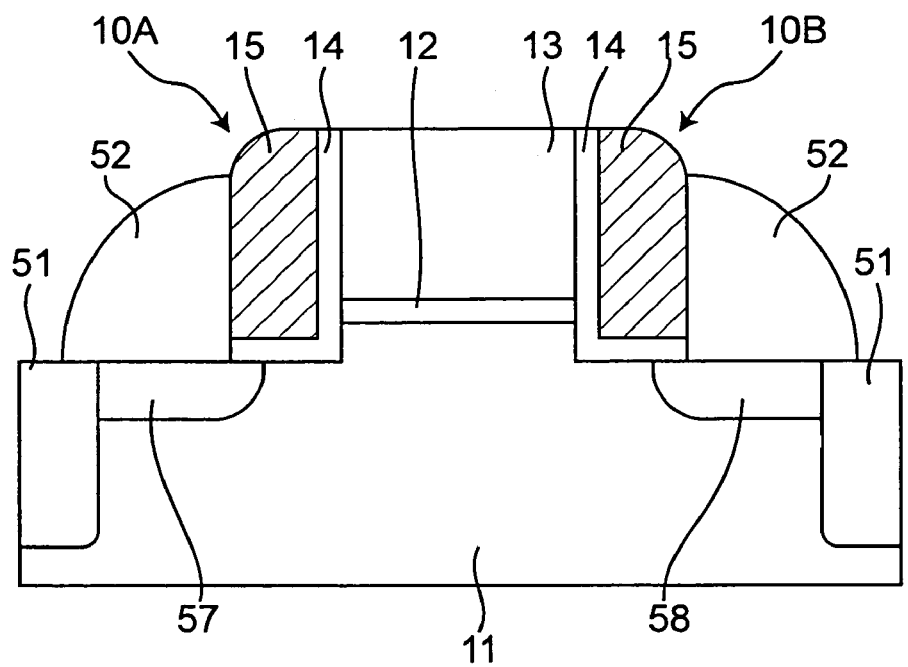
FIG. 24 is a schematic cross-sectional view of essential parts of another embodiment of the semiconductor storage device of this invention.
Figure 25:
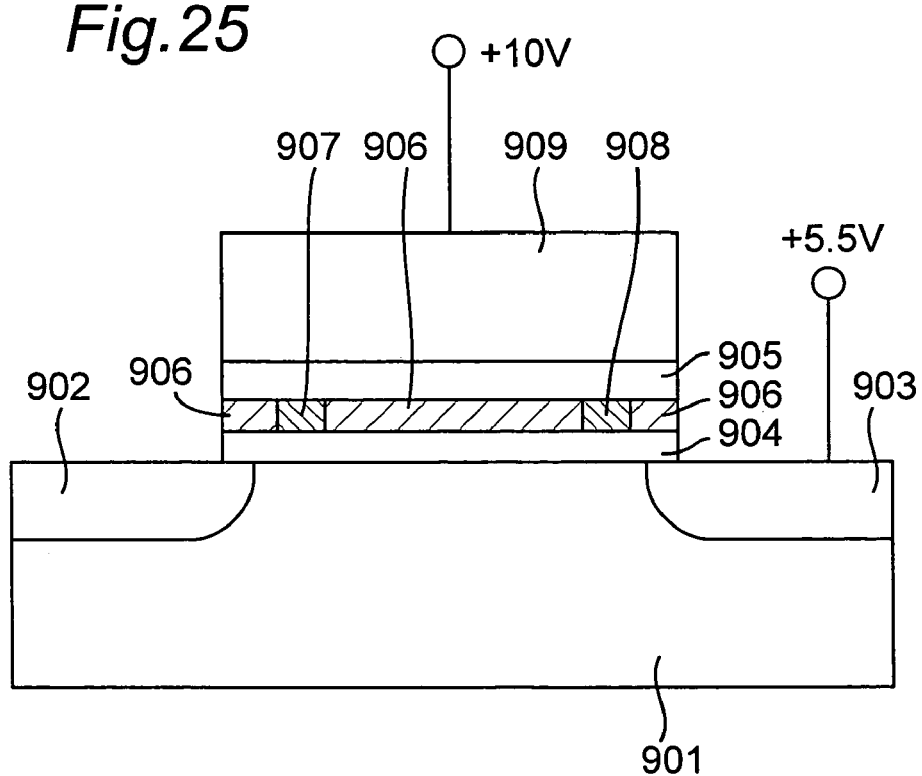
FIG. 25 is a schematic cross-sectional view of essential parts of a conventional semiconductor storage device.

A specific example of the structure where part of the source/drain region is formed at the position higher than the surface of the channel region is shown in FIG. 24. A conductive side wall 52 composed of, for example, polysilicon, amorphous silicon or the like is formed on the sides of the charge holding portions 10A, 10B. The source/drain regions are formed by injecting impurities into the conductive side walls 52 and then performing a thermal treatment so that impurities are diffused therein. At this time, impurities are also diffused to the inside of the semiconductor substrate 11 (regions 57, 58). In this case, the source region (or the drain region) consists of the side wall 52 and the region 57 (or 58). Therefore, part of the source/drain region is located at a position higher than that of the surface of the channel region. Reference numeral 51 indicates a device isolation region.

With the above constitution, since the thickness of the source/drain region increases compared with the case where the source/drain region consists of only the regions 57, 58, the source/drain resistance can be reduced. Therefore, the memory device is enabled to execute high-speed read operation. Furthermore, in the case where the conductive side wall 52 is composed of polysilicon or amorphous silicon, the impurity diffusion speed in the polysilicon or amorphous silicon during the thermal treatment is extremely larger than that in the semiconductor substrate 11 and thus the thickness of the region 57, 58 can be easily made extremely thin. That is, the shallow junction of the source/drain region is facilitated. Accordingly, the miniaturization of the memory device is facilitated.

The semiconductor storage device of the present invention uses a single gate electrode formed on the gate insulating film, a source region, a drain region, and a semiconductor substrate as four terminals, and executes write (program), erase and read operations by giving specified potentials to each of these four terminals. The principle of the operations and examples of operation voltages are as described above.

When the semiconductor storage devices of the present invention are disposed in an array to constitute a memory cell array, a single control gate is capable of controlling each memory cell, which makes it possible to decrease the number of word lines.

The semiconductor storage device of the present invention can be formed by a normal semiconductor fabrication process, for example, by a method similar to a method for forming a multilayer-structured side wall spacer on each side surface of a gate electrode. More specifically, there is a method in which after the gate electrode is formed, a multilayer composed of an insulating film (second insulator), an electric charge storage film (first insulator), and an insulating film (second insulator) is formed and then etched back under an appropriate condition to leave the multilayer film in the form of a side wall spacer. In addition, depending on the structure of a desired charge holding portion, conditions and deposits in forming the side wall may be appropriately selected.

The semiconductor storage device of the present invention is applicable to battery-driven portable electronic apparatuses, in particular portable information terminals. Examples of the portable electronic apparatuses include portable information terminals, cell phones, gaming devices and the like.

The invention being thus described, it will be obvious that the same is not limited to the above-described embodiments, but may be varied in many ways within the scope of the following claims. Also, any modifications and variants achieved by appropriately combining the technical features of the disclosed embodiments should also be regarded to be included within the scope of the following claims.

What is claimed is:

1. A semiconductor storage device comprising:
   a first conductivity type semiconductor part composed of any one of a semiconductor substrate a well region provided in a semiconductor substrate and a semiconductor film disposed on an insulator;
   a gate insulating film formed on the first conductivity type semiconductor part;
   a gate electrode formed on the gate insulating film;
   charge holding portions formed on opposite sides of the gate electrode;
   second conductivity type diffusion layer regions formed in regions of the first conductivity type semiconductor part corresponding to the respective charge holding portions; and
   a channel region below the gate electrode; wherein
   the charge holding portions are each constructed so as to change, in accordance with an electric charge amount held in the charge holding portions, a current amount flowing from one of the second conductivity type diffusion layer regions to the other of the diffusion layer regions through the channel region when a voltage is applied to the gate electrode; and
   part of each charge holding portion is present below an interface of the gate insulating film and the channel region.

2. The semiconductor storage device as defined in claim 1, wherein
   a distance (D) between the interface of the gate insulating film and the channel region and a plane approximately parallel to the interface and containing a bottom of each charge holding portion is 2 nm to 15 nm.

3. The semiconductor storage device as defined in claim 1, wherein
   the charge holding portions each include:
      a first insulator having a function of holding electric charges; and
      a second insulator having a function of preventing dissipation of the electric charges held in the first insulator by separating the first insulator from the gate electrode, the channel region and the corresponding diffusion layer region.

4. The semiconductor storage device as defined in claim 3, wherein
   the first insulator is silicon nitride, and the second insulator is silicon oxide.

5. The semiconductor storage device as defined in claim 1, wherein
   the charge holding portions each include a first insulator having a function of storing electric charges, and second and third insulators having a function of preventing dissipation of the electric charges held in the first insulator, and the first insulator is interposed between the second insulator and the third insulator.

6. The semiconductor storage device as defined in claim 5, wherein
   the first insulator is silicon nitride, and the second and third insulators are silicon oxide.

7. The semiconductor storage device as defined in claim 5, wherein
   the second insulator is provided in a manner so as to separate the first insulator from the gate electrode, the channel region and the corresponding diffusion layer region, and
   a thickness (T1) of the second insulator on the channel region is smaller than a thickness (T2) of the gate insulating film, but 0.8 nm or more.

8. The semiconductor storage device as defined in claim 5, wherein
   the second insulator is formed in a manner so as to separate the first insulator from the gate electrode, the channel region and the diffusion layer region, and
   a thickness (T1) of the second insulator on the channel region is larger than a thickness (T2) of the gate insulating film, but not more than 20 nm.

9. The semiconductor storage device as defined in claim 5, wherein
   the first insulator includes a portion opposed to a plane parallel to a top surface of the gate insulating film, with the second insulator disposed therebetween, the portion of the first insulator extending along the plane.

10. The semiconductor storage device as defined in claim 9, wherein the first insulator includes a portion opposed to a side surface of the gate electrode, with the second insulator disposed therebetween, the portion of the first insulator extending along the side surface.

11. The semiconductor storage device as defined in claim 1, wherein the charge holding portions are arranged in a channel length direction such that at least part of each charge holding portion is laid on the corresponding diffusion layer region.

12. The semiconductor storage device as defined in claim 1, wherein a distance (B) between the diffusion layer regions is set longer than a gate electrode length (A) in a channel length direction, and the charge holding portions are arranged in the channel length direction such that only part of each charge holding portion is laid on the corresponding diffusion layer region.

* * * * *